United States Patent
Li

(10) Patent No.: US 8,669,154 B2
(45) Date of Patent: *Mar. 11, 2014

(54) TRANSISTOR DEVICE AND METHOD OF MANUFACTURE THEREOF

(75) Inventor: Hong-Jyh Li, Austin, TX (US)

(73) Assignee: Infineon Technologies AG, Neubiberg (DE)

( * ) Notice: Subject to any disclaimer, the term of this patent is extended or adjusted under 35 U.S.C. 154(b) by 112 days.

This patent is subject to a terminal disclaimer.

(21) Appl. No.: 13/109,391

(22) Filed: May 17, 2011

(65) Prior Publication Data

US 2011/0223728 A1  Sep. 15, 2011

Related U.S. Application Data

(62) Division of application No. 12/109,976, filed on Apr. 25, 2008, now Pat. No. 7,964,460, which is a division of application No. 11/017,062, filed on Dec. 20, 2004, now Pat. No. 8,399,934.

(51) Int. Cl.
*H01L 21/8238* (2006.01)

(52) U.S. Cl.
USPC ........... 438/216; 438/199; 438/261; 257/310; 257/369

(58) Field of Classification Search
USPC ......... 257/310, 350, 351, 369, 371, E21.632, 257/E21.639, E21.611; 438/216, 261, 287, 438/591

See application file for complete search history.

(56) References Cited

U.S. PATENT DOCUMENTS

| | | | |
|---|---|---|---|
| 4,432,035 A | 2/1984 | Hsieh et al. | |
| 4,990,974 A | 2/1991 | Vinal | |
| 5,041,885 A | 8/1991 | Gualandris et al. | |
| 5,066,995 A | 11/1991 | Young et al. | |
| 5,108,935 A | 4/1992 | Rodder | |
| 5,162,263 A | 11/1992 | Kunishima et al. | |
| 5,321,287 A | 6/1994 | Uemura et al. | |
| 5,352,631 A | 10/1994 | Sitaram et al. | |
| 5,763,922 A | 6/1998 | Chau | |
| 5,780,330 A | 7/1998 | Choi | |
| 5,904,552 A * | 5/1999 | Shiralagi et al. | 438/514 |

(Continued)

FOREIGN PATENT DOCUMENTS

| | | |
|---|---|---|
| EP | 1 298 772 A2 | 9/2002 |
| EP | 1 388 889 A2 | 2/2004 |

(Continued)

OTHER PUBLICATIONS

Li, H.-J., et al., "Dual High-κ Gate Dielectric with Poly Gate Electrode: HfSiON on nMOS and Al$_2$O$_3$ Capping Layer on pMOS," IEEE Electron Device Letters, vol. 29, No. 7, Jul. 2005, pp. 441-444.

(Continued)

*Primary Examiner* — Phuc Dang
(74) *Attorney, Agent, or Firm* — Slater & Matsil, L.L.P.

(57) ABSTRACT

A CMOS device includes high k gate dielectric materials. A PMOS device includes a gate that is implanted with an n-type dopant. The NMOS device may be doped with either an n-type or a p-type dopant. The work function of the CMOS device is set by the material selection of the gate dielectric materials. A polysilicon depletion effect is reduced or avoided.

9 Claims, 11 Drawing Sheets

(56) References Cited

U.S. PATENT DOCUMENTS

| | | | |
|---|---|---|---|
| 5,994,747 A | 11/1999 | Wu | |
| 6,020,243 A | 2/2000 | Wallace et al. | |
| 6,027,961 A | 2/2000 | Maiti et al. | |
| 6,033,944 A | 3/2000 | Shida | |
| 6,048,769 A | 4/2000 | Chau | |
| 6,084,280 A | 7/2000 | Gardner et al. | |
| 6,107,656 A | 8/2000 | Igarashi | |
| 6,124,171 A | 9/2000 | Arghavani et al. | |
| 6,125,534 A | 10/2000 | Varreng | |
| 6,159,782 A | 12/2000 | Xiang et al. | |
| 6,159,810 A | 12/2000 | Yang | |
| 6,171,910 B1 | 1/2001 | Hobbs et al. | |
| 6,184,072 B1 | 2/2001 | Kaushik et al. | |
| 6,218,309 B1* | 4/2001 | Miller et al. | 438/700 |
| 6,225,163 B1 | 5/2001 | Bergemont | |
| 6,291,867 B1 | 9/2001 | Wallace et al. | |
| 6,337,248 B1 | 1/2002 | Imai | |
| 6,348,390 B1 | 2/2002 | Wu | |
| 6,373,111 B1 | 4/2002 | Zheng et al. | |
| 6,410,967 B1 | 6/2002 | Hause et al. | |
| 6,426,534 B1* | 7/2002 | Look et al. | 257/391 |
| 6,432,776 B1* | 8/2002 | Ono | 438/275 |
| 6,444,555 B2 | 9/2002 | Ibok | |
| 6,448,127 B1 | 9/2002 | Xiang et al. | |
| 6,475,908 B1 | 11/2002 | Lin et al. | |
| 6,492,217 B1 | 12/2002 | Bai et al. | |
| 6,528,858 B1* | 3/2003 | Yu et al. | 257/493 |
| 6,538,278 B1 | 3/2003 | Chau | |
| 6,563,178 B2 | 5/2003 | Moriwaki et al. | |
| 6,563,183 B1 | 5/2003 | En et al. | |
| 6,586,296 B1 | 7/2003 | Watt | |
| 6,621,114 B1 | 9/2003 | Kim | |
| 6,656,764 B1 | 12/2003 | Wang et al. | |
| 6,660,608 B1 | 12/2003 | Buynoski | |
| 6,693,333 B1 | 2/2004 | Yu | |
| 6,716,685 B2 | 4/2004 | Lahaug | |
| 6,720,221 B1 | 4/2004 | Ahn et al. | |
| 6,737,313 B1 | 5/2004 | Marsh et al. | |
| 6,740,944 B1 | 5/2004 | McElheny et al. | |
| 6,747,318 B1 | 6/2004 | Kapre et al. | |
| 6,812,542 B2 | 11/2004 | Kohyama | |
| 6,852,584 B1 | 2/2005 | Chen et al. | |
| 6,852,645 B2 | 2/2005 | Colombo et al. | |
| 6,855,605 B2 | 2/2005 | Jurczak et al. | |
| 6,890,807 B2 | 5/2005 | Chau et al. | |
| 6,897,095 B1* | 5/2005 | Adetutu et al. | 438/119 |
| 6,921,691 B1 | 7/2005 | Li et al. | |
| 7,060,568 B2 | 6/2006 | Metz et al. | |
| 7,087,476 B2* | 8/2006 | Metz et al. | 438/199 |
| 7,091,568 B2 | 8/2006 | Hegde et al. | |
| 7,105,889 B2* | 9/2006 | Bojarczuk et al. | 257/324 |
| 7,348,284 B2 | 3/2008 | Doyle et al. | |
| 7,361,958 B2 | 4/2008 | Brask et al. | |
| 2001/0012653 A1 | 8/2001 | Tsukamoto | |
| 2002/0005556 A1 | 1/2002 | Cartier et al. | |
| 2002/0053711 A1 | 5/2002 | Chau et al. | |
| 2002/0086507 A1 | 7/2002 | Park et al. | |
| 2002/0090773 A1 | 7/2002 | Bojarczuk, Jr. et al. | |
| 2002/0098649 A1 | 7/2002 | Chien et al. | |
| 2002/0135030 A1 | 9/2002 | Horikawa | |
| 2002/0135048 A1 | 9/2002 | Ahn et al. | |
| 2002/0151125 A1* | 10/2002 | Kim et al. | 438/199 |
| 2002/0153573 A1 | 10/2002 | Mogami | |
| 2003/0001225 A1* | 1/2003 | Goda et al. | 257/499 |
| 2003/0057432 A1 | 3/2003 | Gardner et al. | |
| 2003/0099766 A1 | 5/2003 | Jurczak et al. | |
| 2003/0104663 A1 | 6/2003 | Visokay et al. | |
| 2003/0109130 A1* | 6/2003 | Huang | 438/633 |
| 2003/0116804 A1 | 6/2003 | Visokay et al. | |
| 2003/0137017 A1 | 7/2003 | Hisamoto et al. | |
| 2003/0141560 A1 | 7/2003 | Sun | |
| 2003/0151074 A1 | 8/2003 | Zheng et al. | |
| 2003/0203560 A1 | 10/2003 | Ryu et al. | |
| 2003/0219953 A1 | 11/2003 | Mayuzumi | |
| 2004/0000695 A1 | 1/2004 | Matsuo | |
| 2004/0005749 A1 | 1/2004 | Choi et al. | |
| 2004/0009675 A1 | 1/2004 | Eissa et al. | |
| 2004/0023462 A1 | 2/2004 | Rotondaro et al. | |
| 2004/0026765 A1 | 2/2004 | Currie et al. | |
| 2004/0033677 A1* | 2/2004 | Arghavani et al. | 438/510 |
| 2004/0106249 A1 | 6/2004 | Huotari | |
| 2004/0132271 A1 | 7/2004 | Ang et al. | |
| 2004/0137703 A1 | 7/2004 | Gao et al. | |
| 2004/0171222 A1 | 9/2004 | Gao et al. | |
| 2004/0180487 A1 | 9/2004 | Eppich et al. | |
| 2004/0180522 A1 | 9/2004 | Nishida et al. | |
| 2004/0217429 A1 | 11/2004 | Lin et al. | |
| 2004/0242021 A1 | 12/2004 | Kraus et al. | |
| 2004/0262683 A1* | 12/2004 | Bohr et al. | 257/338 |
| 2004/0266204 A1 | 12/2004 | Lim et al. | |
| 2005/0035345 A1 | 2/2005 | Lin et al. | |
| 2005/0064663 A1 | 3/2005 | Saito | |
| 2005/0067704 A1 | 3/2005 | Kaneko et al. | |
| 2005/0098839 A1 | 5/2005 | Lee et al. | |
| 2005/0101159 A1 | 5/2005 | Droopad | |
| 2005/0118764 A1* | 6/2005 | Chou et al. | 438/275 |
| 2005/0139926 A1 | 6/2005 | Shimizu et al. | |
| 2005/0148131 A1 | 7/2005 | Brask | |
| 2005/0224897 A1 | 10/2005 | Chen et al. | |
| 2005/0245019 A1 | 11/2005 | Luo et al. | |
| 2005/0280104 A1 | 12/2005 | Li | |
| 2006/0001106 A1* | 1/2006 | Metz et al. | 257/369 |
| 2006/0003507 A1 | 1/2006 | Jung et al. | |
| 2006/0017112 A1 | 1/2006 | Wang et al. | |
| 2006/0038236 A1 | 2/2006 | Yamamoto | |
| 2006/0068575 A1* | 3/2006 | Gluschenkov et al. | 438/585 |
| 2006/0118879 A1 | 6/2006 | Li | |
| 2006/0125018 A1 | 6/2006 | Lee et al. | |
| 2006/0131652 A1 | 6/2006 | Li | |
| 2006/0141729 A1 | 6/2006 | Wang et al. | |
| 2006/0211195 A1 | 9/2006 | Luan | |
| 2006/0223335 A1 | 10/2006 | Mathew et al. | |
| 2006/0275975 A1 | 12/2006 | Yeh et al. | |
| 2006/0292773 A1 | 12/2006 | Goolsby et al. | |
| 2007/0018245 A1 | 1/2007 | Jeng | |
| 2007/0020903 A1 | 1/2007 | Takehara et al. | |
| 2007/0034945 A1 | 2/2007 | Bohr et al. | |
| 2008/0191286 A1 | 8/2008 | Chang et al. | |

FOREIGN PATENT DOCUMENTS

| | | |
|---|---|---|
| EP | 1 531 496 A2 | 5/2005 |
| EP | 1 538 674 A2 | 6/2005 |
| JP | 2000-031296 | 1/2000 |
| JP | 2000-058668 | 2/2000 |
| JP | 2001217321 A | 8/2001 |
| JP | 2002-118175 | 4/2002 |
| JP | 2003-273350 | 9/2003 |
| JP | 2004-221596 | 8/2004 |
| JP | 2004-260165 | 9/2004 |
| JP | 2004-289061 | 10/2004 |
| JP | 2004-356472 | 12/2004 |
| JP | 2005-268553 | 9/2005 |
| WO | WO 01/66832 A2 | 9/2001 |
| WO | WO 2004/095556 A1 | 11/2004 |
| WO | WO 2005/114718 A1 | 12/2005 |
| WO | WO 2006/061371 A1 | 6/2006 |
| WO | WO 2006/067107 A1 | 6/2006 |

OTHER PUBLICATIONS

Hobbs, C.C., et al., "Fermi-Level Pinning at the Polysilicon/Metal Oxide Interface—Part I," IEEE Transactions on Electron Devices, vol. 51, No. 6, Jun. 2004, pp. 971-977.

Lin, R., et al., "An Adjustable Work Function Technology Using Mo Gate for CMOS Devices," IEEE Electron Device Letters, Jan. 2002, pp. 49-51, vol. 23, No. 1, IEEE, Los Alamitos, CA.

Wolf, S., et al., "Silicon Processing for the VLSI Era: vol. I—Process Technology," pp. 388 and 526, Second Edition, Lattice Press, Sunset Beach, CA.

Wolf, S., "Silicon Processing for the VLSI Era: vol. II—CMOS Process Integration," 1990, pp. 432-441, Lattice Press, Sunset Beach, CA.

(56) References Cited

OTHER PUBLICATIONS

Hobbs, C., et al., "Fermi Level Pinning at the PolySi/Metal Oxide Interface," 2003 Symposium on VLSI Technology Digest of Technical Papers, Jun. 2003.

Samavedam, S.B., et al., "Fermi Level Pinning with Sub-Monolayer MeOx and Metal Gates," IEEE, Mar. 2003.

"Front End Processes," The International Technology Roadmap for Semiconductors (ITRS), 2002 Update, pp. 45-62, http://member.itrs.net/.

Guha, S., et al., "Atomic Beam Deposition of Lanthanum- and Yttrium-Based Oxide Thin Films for Gate Dielectrics," Applied Physics Letters, Oct. 23, 2000, vol. 77, No. 17, pp. 2710-2712, American Institute of Physics.

"High κ Dielectric Materials," Tutorial: Materials for Thin Films / Microelectronics, pp. 1-3, Sigma-Aldrich Co., St. Lois, Missouri, US, http://www.sigmaaldrich.com/Area_of_Interest/Organic_Inorganic_Chemistry/Materials_Science/Thin_Films_Microelectronics/Tutorial/Dielectric_Materials.html, downloaded Jun. 9, 2004.

Muller, R.S., et al., "Device Electronics for Integrated Circuits," Second Ed., 1986, pp. 380-385, 398-399, John Wiley & Sons, New York, NY.

"Front End Processes," The International Technology Roadmap for Semiconductors: 2003 Edition, pp. 23-25, http://member.itrs.net/.

Gannavaram, S., et al., "Low Temperature (≤ 800° C.) Recessed Junction Selective Silicon-Germanium Source/Drain Technology for sub-70 nm CMOS," 2000, 4 pp., IEEE, Los Alamitos, CA.

Huang, F.-J., et al., "Schottky-Clamped NMOS Transistors Implemented in a Conventional 0.8-μm CMOS Process," IEEE Electron Device Letters, Sep. 1998, pp. 326-328, vol. 19, No. 9, IEEE, Los Alamitos, CA.

Park, D.-G., et al., "Thermally Robust Dual-Work Function ALD-$MN_x$ MOSFETs using Conventional CMOS Process Flow," 2004 Symposium on VLSI Technology Digest of Technical Papers, 2004, pp. 186-187, IEEE, Los Alamitos, CA.

Wakabayashi, H., et al., "A Dual-Metal Gate CMOS Technology Using Nitrogen-Concentration-Controlled $TiN_x$ Film," IEEE Transactions on Electron Devices, Oct. 2001, pp. 2363-2369, vol. 48, No. 10, IEEE, Los Alamitos, CA.

Aoyama, T., et al., "Proposal of New HfSiON CMOS Fabrication Process (HAMDAMA) for Low Standby Power Device," IEDM Technical Digest, Dec. 2004, pp. 95-98.

Cho, B., et al. "HfSi Gate Electrode with Tunable Work Function for Advanced CMOS Devices," http://web.archive.org/web/20040814183959/http://www.eng.nus.edu.sg/EResnews/0406/rd/rd_7.html, Aug. 2004.

Choi, K., et al., "Growth Mechanism of TiN Film on Dielectric Films and the Effects on the Work Function," Thin Solid Films 486, 2005, pp. 141-144, Elsevier.

Gao, W., et al., "Stacked Metal Layers as Gates for MOSFET Threshold Voltage Control," Materials Research Society Symposium, 2003, pp. 3-8, vol. 765.

Samavedam, S.B., et al., "Evaluation of Candidate Metals for Dual-Metal Gate CMOS with HfO2 Gate Dielectric," Materials Research Society Symposium, 2002, pp. 85-90, vol. 716, Materials Research Society.

Samavedam, S.B., et al., "Dual-Metal Gate CMOS with HfO2 Gate Dielectric," IEEE, 2002, pp. 433-436.

Li, T.L., et al., "Continuous and Precise Work Function Adjustment for Integratable Dual Metal Gate CMOS Technology Using Hf-Mo Binary Alloys," IEEE Transactions on Electron Devices, Jun. 2005, 8 Pages, vol. 52, No. 6.

Polishchuk, I., et al., "Dual Work Function Metal Gate CMOS Transistors Fabricated by Ni-Ti Interdiffusion," IEEE Electron Device Letters, Apr. 2002, pp. 411-414, vol. 23, Issue 4.

Polishchuk, I., et al., "Polycrystalline Silicon/Metal Stacked Gate for Threshold Voltage Control in Metal-Oxide-Semiconductor Field-Effect Transistors," Applied Physics Letters, Apr. 3, 2000, 3 Pages, vol. 76, No. 14, 2000 American Institute of Physics.

Yeo, Y.C., et al., "Dual-Metal Gate CMOS Technology with Ultrathin Silicon Nitride Gate Dielectric," IEEE Electron Device Letters, May 2001, pp. 227-229, vol. 22, Issue 5.

Ha, D., et al., "Molybdenum-Gate $HfO_2$ CMOS FinFET Technology," 2004 IEEE, IEDM, pp. 27.5.1-27.5.4.

Kedzierski, J., et al., "Fabrication of Metal Gate FinFETs Through Complete Gate Silicidation With Ni," IEEE Transactions on Electron Devices, vol. 51, No. 12, Dec. 2004, pp. 2115-2120.

Kedzierski, J., et al., "Metal-gate FinFET and fully-depleted SOI devices using total gate silicidation," 2002 IEEE, IEDM, pp. 10.1.1-10.1.4.

Kuroi, T., et al., Novel NICE (Nitrogen Implantation into CMOS Gate Electrode and Source-Drain) Structure for High Reliability and High Performance 0.25 μm Dual Gate CMOS, 1993 IEEE, IEDM, pp. 13.2.1-13.2.4.

* cited by examiner

TRANSISTOR DEVICE AND METHOD OF MANUFACTURE THEREOF

This application is a divisional of U.S. application Ser. No. 12/109,976, filed on Apr. 25, 2008 now U.S. Pat. No. 7,964, 460, and entitled "Method of Manufacturing an NMOS Device and a PMOS Device," which is a divisional of U.S. application Ser. No. 11/017,062, filed on Dec. 20, 2004 now U.S. Pat. No. 8,399,934, and entitled "Transistor Device and Method of Manufacture Thereof," which applications are hereby incorporated herein by reference.

CROSS-REFERENCE TO RELATED APPLICATIONS

This application relates to the following co-pending and commonly assigned patent application: Ser. No. 10/870,616, filed on Jun. 17, 2004, and entitled "CMOS Transistor with Dual High-k Gate Dielectric and Method of Manufacture Thereof," which application is hereby incorporated herein by reference.

TECHNICAL FIELD

The present invention relates generally to semiconductor devices, and more particularly structures for and methods of manufacturing transistors.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create either positive or negative channel transistors. More recent designs, referred to as complementary MOS (CMOS) devices, use both positive and negative channel devices, e.g., a positive channel metal oxide semiconductor (PMOS) transistor and a negative channel metal oxide semiconductor (NMOS) transistor, in complementary configurations. An NMOS device negatively charges so that the transistor is turned on or off by the movement of electrons, whereas a PMOS devices involves the movement of electron vacancies. While the manufacture of CMOS devices requires more manufacturing steps and more transistors, CMOS devices are advantageous because they utilize less power, and the devices may be made smaller and faster.

The gate dielectric for MOSFET devices has in the past typically comprised silicon dioxide, which has a dielectric constant of about 3.9. However, as devices are scaled down in size, using silicon dioxide for a gate dielectric becomes a problem because of gate leakage current, which can degrade device performance. Therefore, there is a trend in the industry towards the development of the use of high dielectric constant (k) materials for use as the gate dielectric in MOSFET devices. The term "high k materials" as used herein refers to a dielectric material having a dielectric constant of about 4.0 or greater.

High k gate dielectric development has been identified as one of the future challenges in the 2002 edition of International Technology Roadmap for Semiconductors (ITRS), incorporated herein by reference, which identifies the technological challenges and needs facing the semiconductor industry over the next 15 years. For low power logic (for portable electronic applications, for example), it is important to use devices having low leakage current, in order to extend battery life. Gate leakage current must be controlled in low power applications, as well as sub-threshold leakage, junction leakage, and band-to-band tunneling.

However, one problem with using high k materials as gate dielectric materials is lower mobility, which is undesirable. Device performance using high k dielectric materials tends to suffer from trapped charge in the dielectric layer, which deteriorates the mobility, making the drive current lower than in transistors having silicon dioxide gate oxides, thus reducing the speed and performance of transistors having high k gate dielectric materials.

Polysilicon is most often used as a gate material in transistor devices. Another problem of using high k materials as a gate dielectric is that if polysilicon is used as a gate material in conjunction with a high k gate dielectric, poly (polysilicon) depletion can occur between the gate dielectric and the gate. When a CMOS device is operated in an inversion mode, poly depletion causes an increase in the electrical equivalent gate oxide, e.g., by about 4 to 5 Angstroms. It is desirable for the gate capacitance to be relatively high for increased gate control. However, poly depletion decreases the capacitance and lowers the drive current of the CMOS device, which is undesirable.

What is needed in the art is a transistor design that does not suffer from the poly depletion effect.

Another problem with using a high-k dielectric material as the gate dielectric of a CMOS transistor is referred to in the art as a "Fermi-pinning" effect, which occurs at the interface of the gate electrode and gate dielectric material. Fermi-pinning is a problem that occurs in CMOS devices having both polysilicon and metal gates. The Fermi-pinning effect causes a threshold voltage shift and low mobility, due to the increased charge caused by the Fermi-pinning effect. Fermi-pinning causes an assymmetric turn-on threshold voltage $V_t$ for the two transistors of a CMOS device, which is undesirable.

In prior art CMOS transistor designs, shown in FIG. 20, typically $SiO_2$ was used as a gate dielectric material 580, and polysilicon was used as a gate electrode material 582 and 584. A symmetric threshold voltage $V_t$ for the PMOS device and the NMOS device of a prior art CMOS device 500 was easily achieved using $SiO_2$ as a gate dielectric material 580. The manufacturing steps typically comprised providing a workpiece 502, and forming an n well and p well in the PMOS region and NMOS region, respectively. In some designs, isolation regions 508 were formed between the n well and p well. The gate dielectric 580 was formed over the workpiece 502, and the gate electrode material 582/584 comprising a layer of polysilicon was formed over the gate dielectric 580. The gate electrodes 582 and 584 and gate dielectric 580 were patterned, and the workpiece 502 was lightly doped to form source and drain extensions 507. Spacers 534 were formed over the sidewalls of the gate electrodes 582 and 584 and gate dielectric 580. The workpiece 502 was then more deeply implanted with dopants to form the source and drain regions S and D of the device 500. For the PMOS device, the gate electrode 582 was p-type, which was achieved by doping the polysilicon gate with boron (B). For the NMOS device, the gate electrode 584 was n-type, which was typically achieved by doping the polysilicon gate with phosphorus (P) or arsenic (As), as examples.

In electronics, the "work function" is the energy, usually measured in electron volts, needed to remove an electron from the Fermi level to a point an infinite distance away outside the surface. Work function is a material property of any material, whether the material is a conductor, semiconductor, or dielectric. The work function of a semiconductor can be changed by doping the semiconductor material. For example, undoped polysilicon has a work function of about 4.5 eV, whereas polysilicon doped with boron has a work function of about 5.0 eV. The work function of a semiconductor or conductor directly affects the threshold voltage of a transistor when the material is used as a gate electrode.

In prior art CMOS devices such as device 500 shown in FIG. 20 utilizing $SiO_2$ or SiON as the gate dielectric material 580, the work function of the CMOS device 500 could be changed or tuned by doping the polysilicon used for the gate electrode material 582/584. However, high-k gate dielectric materials such as hafnium-based dielectric materials exhibit Fermi-pinning, which is caused by the interaction of the high-k gate dielectric materials with adjacent materials, e.g., the gate material. When used as a gate dielectric, high k gate dielectric materials pin or fix the work function, so that doping the polysilicon gate material does not change the work function. Thus, a symmetric $V_t$ for the NMOS and PMOS transistors of a CMOS device having a high k material for the gate dielectric cannot be achieved by doping polysilicon gate material, as in $SiO_2$ gate dielectric CMOS devices. A CMOS device having a high k dielectric material for the NMOS and PMOS transistors has an asymmetric $V_{tn}$ and $V_{tp}$, due to the Fermi-pinning effect of the high k dielectric material. Efforts have been made to improve the quality of high-k dielectric films and resolve the Fermi-pinning problems, but the efforts have resulted in little success.

Thus, what is needed in the art is a CMOS transistor device design and method of manufacturing thereof that has a high-k gate dielectric material and a symmetric $V_t$ for the p channel metal oxide semiconductor (PMOS) and n channel metal oxide semiconductor (NMOS) transistors of the CMOS device, that does not exhibit a polysilicon depletion effect.

SUMMARY OF THE INVENTION

These and other problems are generally solved or circumvented, and technical advantages are generally achieved, by preferred embodiments of the present invention, which provide transistors and methods of manufacture thereof having a substantially symmetric threshold voltage $V_t$ for the PMOS and NMOS transistors. The gate material of a PMOS transistor is doped with an n-type dopant, and the gate of an NMOS transistor is doped with a p-type dopant or n-type dopant, in a CMOS device. In some embodiments, a different gate dielectric material is used for the PMOS transistor than for the NMOS transistor. Polysilicon depletion effects are reduced or avoided by the novel embodiments of the present invention described herein.

In accordance with a preferred embodiment of the present invention, a transistor includes a workpiece, the workpiece having a region implanted with a first dopant. A gate dielectric is disposed over the workpiece. A gate is disposed over the gate dielectric, the gate comprising a semiconductive material and being implanted with the first dopant. A source region and a drain region are formed in the region of the workpiece, wherein the source region and the drain region are proximate the gate dielectric.

In accordance with another preferred embodiment of the present invention, a CMOS device includes a workpiece and a PMOS transistor and NMOS transistor formed in a first region and a second region, respectively, of the workpiece. The PMOS transistor includes a first gate dielectric disposed over the workpiece and a first gate disposed over the first gate dielectric. The first gate comprises a first semiconductive material comprising an n-type dopant. The NMOS transistor includes a second gate dielectric disposed over the workpiece and a second gate disposed over the first gate dielectric. The second gate comprises a second semiconductive material.

In accordance with yet another preferred embodiment of the present invention, a method of manufacturing a transistor includes providing a workpiece, implanting a first dopant into the workpiece, and forming a gate dielectric over the workpiece. A gate is formed over the gate dielectric, the gate comprising a semiconductive material. The method includes implanting the first dopant into the gate.

In accordance with another preferred embodiment of the present invention, a method of manufacturing a CMOS device includes providing a workpiece, forming a PMOS transistor in a first region of the workpiece, and forming an NMOS transistor in a second region of the workpiece. The PMOS transistor comprises a first gate dielectric disposed over the workpiece and a first gate disposed over the first gate dielectric, the first gate comprising a first semiconductive material. The method includes implanting an n-type dopant into the first semiconductive material of the first gate. The NMOS transistor includes a second gate dielectric disposed over the workpiece and a second gate disposed over the second gate dielectric, the second gate comprising a second semiconductive material.

Advantages of preferred embodiments of the present invention include providing a method of fabricating a CMOS device and structure thereof, wherein the PMOS transistor and NMOS transistor have a symmetric $V_t$. The threshold voltage $V_t$ is decreased compared to prior art CMOS devices, and the flat band voltage is easier to tune. Embodiments of the invention may utilize high-k dielectric materials as the gate dielectric, using polysilicon, partially silicided, or fully silicided gate electrodes. Polysilicon depletion and boron penetration effects when the device is operated in an inversion mode are prevented, because the semiconductive material of the gates function in an accumulation regime, due to the presence of the novel reversal of dopants implanted in the PMOS and NMOS gates. The capacitance effective thickness (CET) of a CMOS device can be decreased in accordance with embodiments of the present invention.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
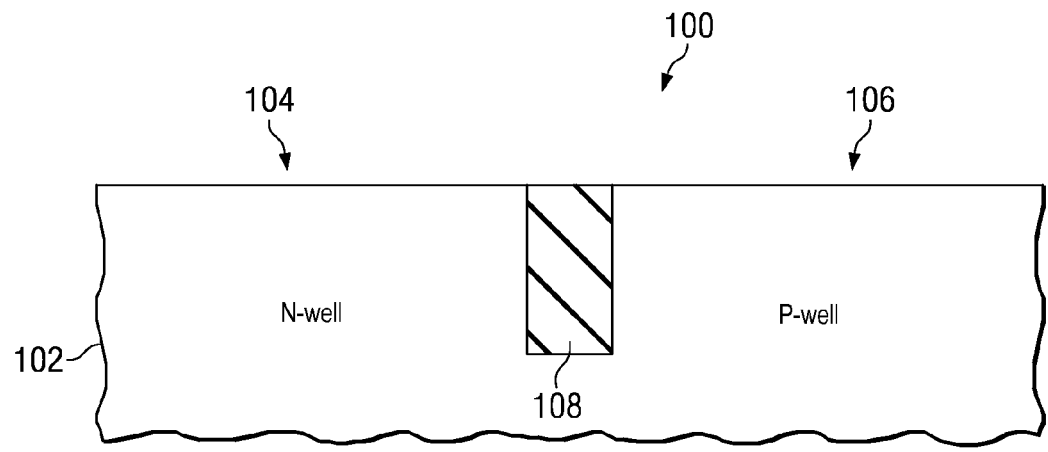
FIGS. 1 through 9 show cross-sectional views of a semiconductor device at various stages of manufacturing in accordance with a preferred embodiment of the present invention, wherein a CMOS device comprises a PMOS transistor having a first gate dielectric material and an NMOS transistor having a second gate dielectric material, wherein the first gate dielectric material and the second gate dielectric material comprise different materials, and wherein the gate of the PMOS transistor is doped with an n-type dopant, and the gate of the NMOS transistor is doped with a p-type dopant or an n-type dopant.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

High-k gate dielectrics generally yield orders of magnitude lower gate leakage current than $SiO_2$ gate dielectrics with the same effective oxide thickness (EOT). For low standby power (LSTP) and high performance (HP) applications, the use of a high-k material for a gate dielectric is a potential solution in the roadmap for the advanced technology nodes. Using high-k materials for gate dielectrics in CMOS devices has resulted in good EOT, lower gate leakage ($J_g$), mobility and hysteresis parameters, but the devices suffer from lack of $V_t$ controllability. In order to make high-k materials as gate dielectrics useful in CMOS applications, it is desirable that the CMOS device should be manufactured such that $V_{tn}$ and $V_{tp}$ are symmetrical; e.g., $V_{tn}$=0.3 V and $V_{tp}$=−0.3 V, as examples.

Attempts to use a high-k dielectric material such as $HfO_2$ have been problematic. In particular, attempts have been made to use $HfO_2$, which is a high-k dielectric material having a dielectric constant of about 25, as the gate dielectric for both the PMOS and NMOS FETs of a CMOS device. The work function of a polysilicon gate using a $HfO_2$ gate dielectric has been found to be pinned, as a result of Fermi-pinning, at a point close to the conduction band of polysilicon, causing the polysilicon gate to function as n-type polysilicon, even for the polysilicon gate doped with p-type dopant, for the PMOS device. Therefore, the threshold voltage $V_{tp}$ of the PMOS device was found to be much higher than expected; e.g., $V_{tp}$ was −1.2 V while $V_{tn}$ was 0.4 V, which is very asymmetric. The Fermi-pinning effect is suspected to be related to the Hf—Si bond at the gate electrode to gate dielectric interface, which is almost impossible to avoid with a polysilicon-$HfO_2$ gate stack structure. Therefore, the Fermi-pinning effect makes the use of polysilicon as a gate electrode incompatible with Hf-based high-k gate dielectric materials in CMOS devices. Fully silicided polysilicon (FUSI) gates have also exhibited Fermi-pinning effects and are undesirable for use as gate electrode materials when a high-k dielectric such as hafnium is used for a gate dielectric.

Another problem of prior art CMOS devices is a polysilicon depletion effect, which occurs when the device is operated in the inversion regime; e.g., $V>V_{tn}$, in the NMOS transistor or $V<V_{tp}$ in the PMOS transistor. In the inversion regimes, the gate voltage causes the bottom of the gate to become depleted of electrons for the NMOS transistor and to become depleted of holes for the PMOS transistor. The depleted region at the bottom of the gates at the interface of the gates and the gate dielectric materials reduces the total capacitance of the gate stack, and hence, increases the capacitive effective thickness (CET). As a result, the drive current is reduced, which is undesirable.

Embodiments of the present invention derive technical advantages by disposing a thin layer of a Fermi-pinning material such as $Al_2O_3$ adjacent and abutting a gate electrode of a PMOS device, disposed over a high-k dielectric material such as $HfO_2$, while using a single layer of high-k dielectric material as the gate dielectric for the NMOS device. By doing so, polysilicon or FUSI may be used as the gate electrode while still achieving a symmetric $V_{tp}$ and $V_{tn}$ for the CMOS device. In the PMOS portion, a polysilicon to $Al_2O_3$ interface sets the work function in the p-type regime, and in the NMOS portion, a polysilicon to Hf interface sets the work function in the n-type regime. The gate of the PMOS device is preferably doped with an n-type dopant, and the gate of the NMOS device may be doped with a p-type or an n-type dopant, to avoid the polysilicon depletion effect.

The present invention will be described with respect to preferred embodiments in a specific context, namely a CMOS transistor. Embodiments of the present invention may also be applied, however, to other semiconductor device applications where one or more transistors are utilized. Embodiments of the present invention have useful application in single NMOS transistor or single PMOS transistor designs, for example. Note that in the drawings shown, only one PMOS device and one NMOS device are shown; however, there may be many PMOS and NMOS devices formed on a semiconductor workpiece during each of the manufacturing processes described herein.

FIGS. 1 through 9 show cross-sectional views of a semiconductor device 100 at various stages of manufacturing in accordance with a preferred embodiment of the present invention. With reference now to FIG. 1, there is shown a semiconductor device 100 in a cross-sectional view including a workpiece 102. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise a silicon-on-insulator (SOI) substrate.

The workpiece 102 includes a first region 104 and a second region 106. The first region 104 comprises a region where a first transistor comprising a PMOS device or PMOSFET, (indicated by the "P" in the workpiece 102 in the figures) as examples, will be formed. The second region 106 comprises a region where a second transistor comprising an NMOS device or NMOSFET (indicated by the "N" in the workpiece 102 in the figures) will be formed, as examples. The PMOS device and NMOS device are not shown in FIG. 1: see FIGS. 8 and 9 at 136 and 138, respectively.

The first region 104 and the second region 106 may be separated by an optional shallow trench isolation (STI) region 108 formed in the workpiece 102, as shown. The first region 104 may be doped with n-type dopants, e.g., to form an N well, and the second region 106 may be doped with p-type dopants, e.g., to form a P well. In general, the workpiece 102 is doped with n- or p-type dopants depending on whether the junctions of the transistor to be formed will be p- or n-type, respectively.

The workpiece 102 is preferably cleaned using a pre-gate clean process to remove contaminants or native oxide from the top surface of the workpiece 102. The pre-gate treatment may comprise a HF, HCl or ozone based cleaning treatment, as examples, although the pre-gate treatment may alternatively comprise other chemistries.

Figure 2:
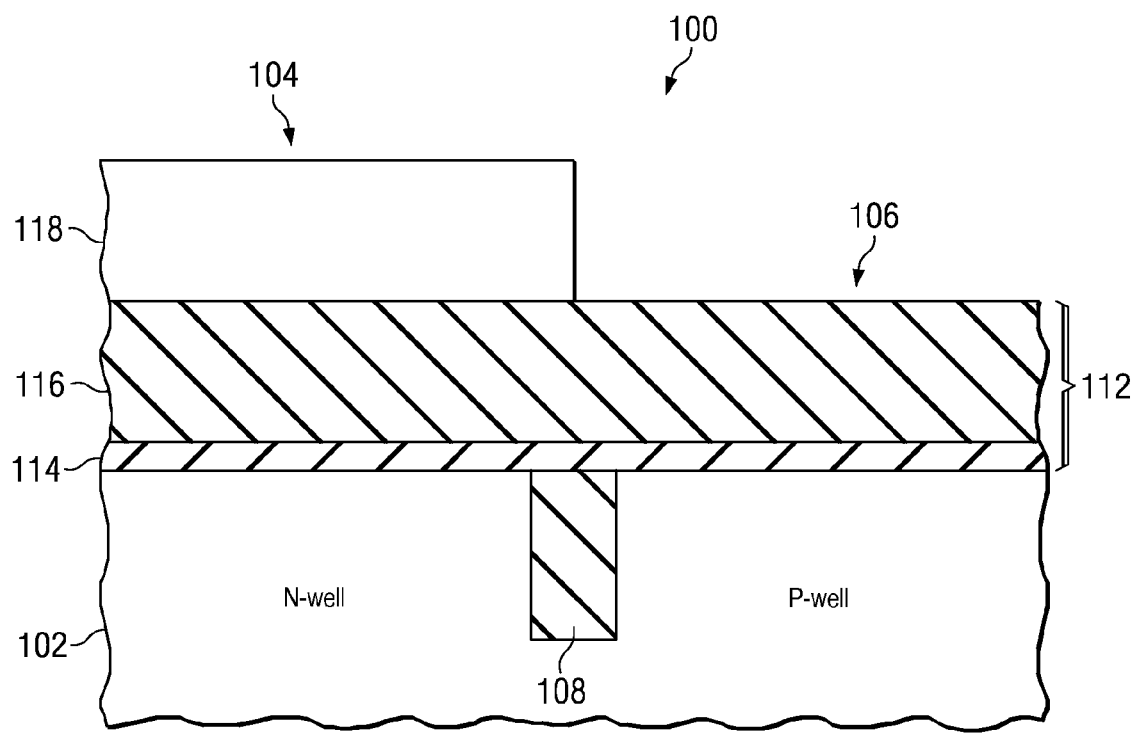

A hard mask 112 is deposited over the workpiece 102, as shown in FIG. 2. The hard mask 112 preferably comprises a first layer 114 and a second layer 116 disposed over the first layer 114, as shown. Alternatively, the hard mask 112 may comprise a single layer of an oxide or a nitride material, for example. In the embodiment shown in FIG. 2, the first layer 114 of the hard mask 112 preferably comprises about 300 Angstroms of an oxide material such as tetraethoxysilate (TEOS), although alternatively, the first layer 114 may comprise other insulating materials deposited in other dimensions, for example. The first layer 114 may be deposited by plasma-enhanced chemical vapor deposition (PECVD) or by other deposition techniques, as examples. The second layer 116 preferably comprises about 1500 Angstroms of a nitride material such as $Si_xN_y$, for example, although alternatively, the second layer 116 may comprise other insulating materials deposited in other dimensions, for example. The second layer 114 may be deposited by PECVD or by other deposition techniques, as examples.

A first layer of photoresist 118 is deposited over the second layer 116 of the hard mask 112, as shown in FIG. 2. The first layer of photoresist 118 may patterned with a mask using traditional lithography techniques, although alternatively, the first layer of photoresist 118 may be directly patterned using electron beam lithography (EBL) or other direct etching technique, as examples.

Figure 3:
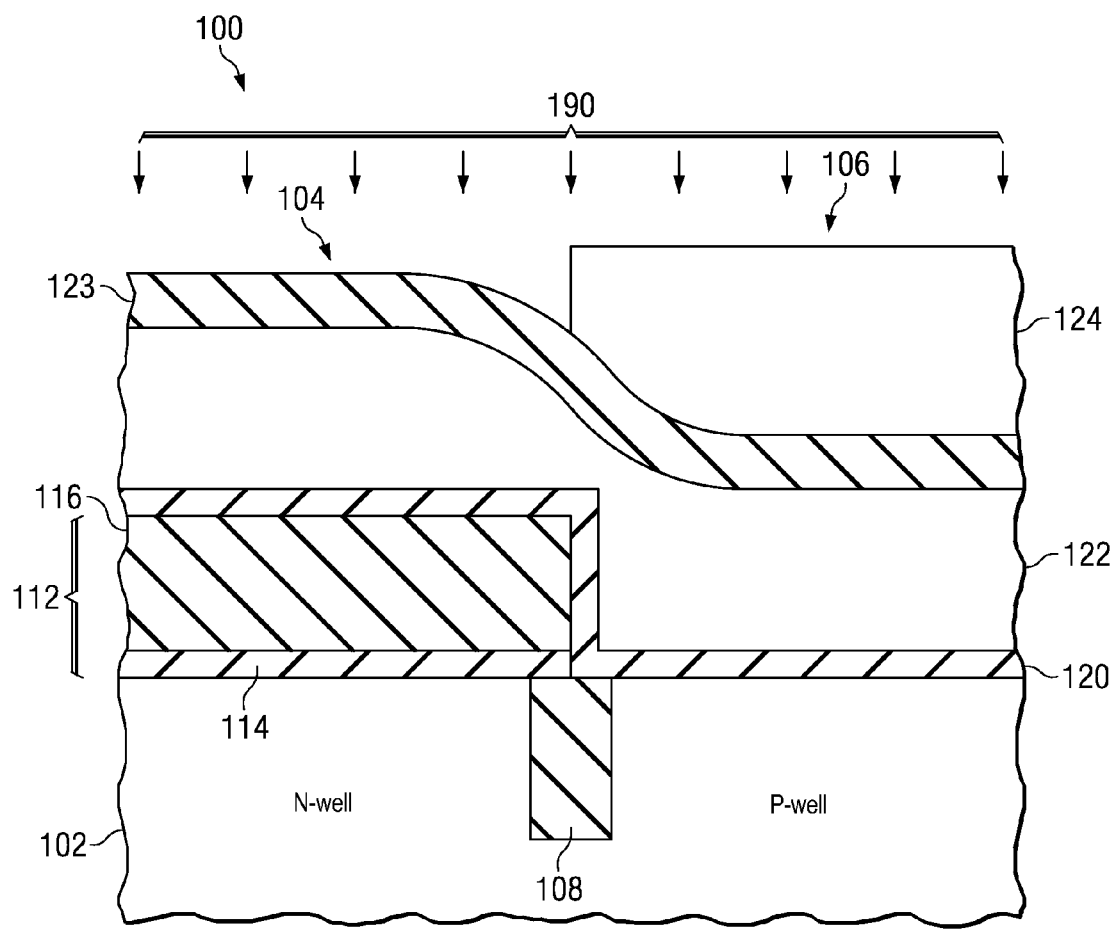

The first layer of photoresist 118 is used to pattern at least the second layer 116 of the hard mask 112, as shown in FIG. 3. For example, exposed portions of the second layer 116 in the second region 106 may be etched using the first layer of photoresist 118 remaining over the first region 104 as a mask. The etch process may be designed to stop when the first layer 114 of the hard mask 112 is reached. The first layer of photoresist 118 is then stripped or removed, and the second layer 116 is then used as a mask to pattern the first layer 114. Alternatively, the first layer of photoresist 118 may be used as a mask to etch both the second layer 116 and the first layer 114 of the hard mask 112, for example. The first layer of photoresist 118 is then stripped or removed.

A first gate dielectric material 120 is deposited over the patterned hard mask 112 and exposed portions of the workpiece 102, as shown in FIG. 3. The first gate dielectric material 120 preferably comprises a high-k dielectric material having a dielectric constant of about 4.0 or greater, in one embodiment. The first gate dielectric material 120 preferably comprises $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples, although alternatively, the first gate dielectric material 120 may comprise other high k insulating materials or other dielectric materials. The first gate dielectric material 120 may comprise a single layer of material, or alternatively, the first gate dielectric material 120 may comprise two or more layers. In one embodiment, one or more of these materials can be included in the first gate dielectric material 120 in different combinations or in stacked layers. The first gate dielectric material 120 may be deposited by chemical vapor deposition (CVD), atomic layer deposition (ALD), metal organic chemical vapor deposition (MOCVD), physical vapor deposition (PVD), or jet vapor deposition (JVD), as examples, although alternatively, the first gate dielectric material 120 may be deposited using other suitable deposition techniques. The first gate dielectric material 120 preferably comprises a thickness of about 10 Å to about 60 Å in one embodiment, although alternatively, the first gate dielectric material 120 may comprise other dimensions, such as about 80 Å or less, as an example.

A first gate material 122 is deposited over the first gate dielectric material 120, also shown in FIG. 3. The first gate material 122 preferably comprises a semiconductive material, such as polysilicon or amorphous silicon, although alternatively, other semiconductive materials may be used for the first gate material 122. In the embodiment shown in FIG. 1-9, the first gate material 122 preferably comprises polysilicon or other semiconductor materials. Alternatively, the first gate material 122 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. If the gate material 122 comprises FUSI, for example, polysilicon may be deposited over the gate dielectric material 120, and a metal such as nickel may be deposited over the polysilicon, although other metals may be used. The workpiece 102 may then be heated to about 600 or 700 degrees C. to form a single layer of nickel silicide. The first gate material 122 may comprise a plurality of stacked gate materials, such as a metal underlayer with a polysilicon cap layer disposed over the metal underlayer. The first gate material 122 may be deposited using CVD, PVD, ALD, or other deposition techniques, as examples. The first gate material 122 preferably comprises a thickness of about 1500 Å, although alternatively, the first gate material 122 may comprise about 1000 Å to about 2000 Å, or other dimensions, for example.

In one embodiment, at this stage of the manufacturing process, in an optional step, the first gate material 122 is implanted with a dopant 190. The dopant 190 may comprise either an n-type dopant or a p-type dopant. For example, the first gate material 122 may be n doped by doping the first gate material 122 with phosphorus or As. Alternatively, in another embodiment, the first gate material 122 may be p doped by doping the first gate material 122 with B. Generally, because polysilicon depletion is not as much of a concern in an NMOS transistor as in a PMOS transistor of a CMOS device, in accordance with an embodiment of the present invention, both the PMOS transistor and NMOS transistor gates may be doped with an n-type dopant.

Doping the first gate material 122 makes the semiconductive material conductive or more conductive. Preferably, the work function of the NMOS transistor (see 138 in FIG. 9) is set by the material selection for the gate dielectric material 120, rather than by the dopant implanted into the first gate material 122, in accordance with an embodiment of the present invention.

Figure 7:
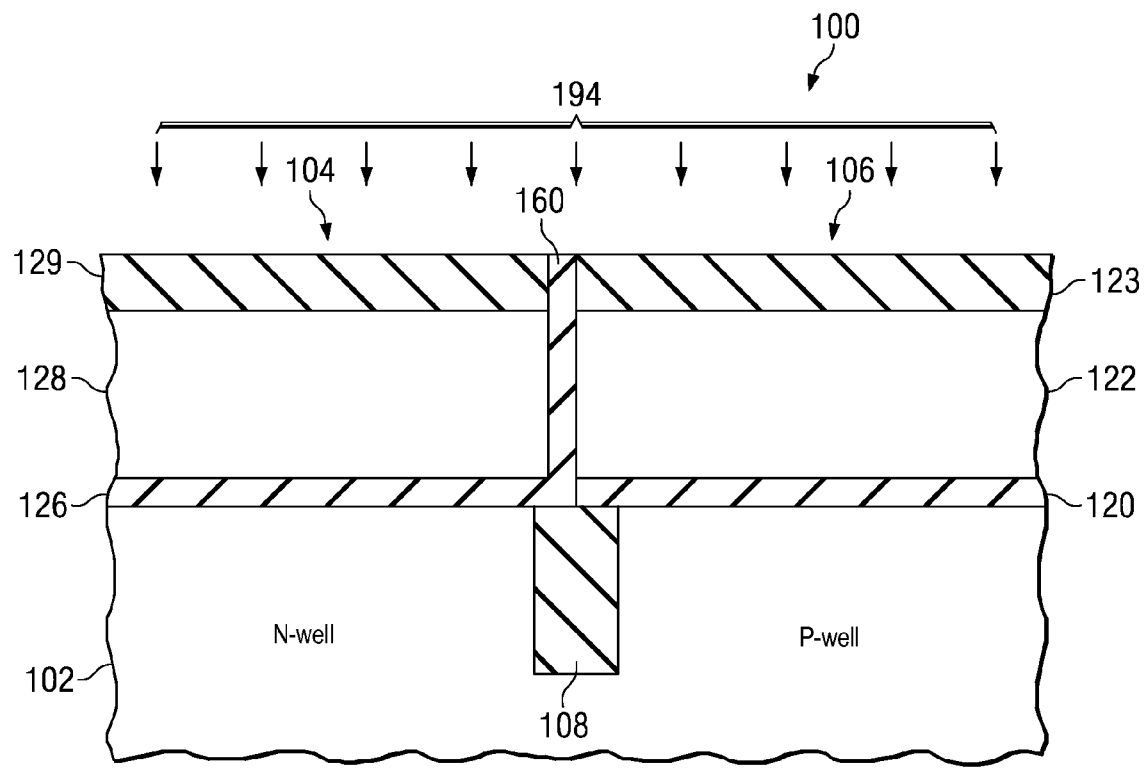

After implanting the dopant 190, an optional hard mask 123 may be deposited over the first gate material 122. The optional hard mask 123 protects the first gate material 122 from being implanted with the dopants that are implanted to form the source and drain extension regions and source and drain regions, to be described further herein. If the first gate material 122 is doped with an n-type dopant, the hard mask 123 may not be required, because the source and drain regions of the NMOS device are doped with n-type, for example. The hard mask 123 also may not be deposited at this stage of the manufacturing process if the gate materials for the PMOS transistor and the NMOS transistor are N doped in a single step, as shown in FIG. 7. The hard mask 123 may comprise about 500 Å or less of an oxide or nitride material, as examples. In one embodiment, the hard mask 123 may comprise about 400 Å of TEOS, for example.

Referring again to FIG. 3, after the optional steps of implanting a p- or n-type dopant into the first gate material 122 and depositing the hard mask 123 over the first gate material 122, a second layer of photoresist 124 is deposited over the optional hard mask 123, as shown in FIG. 3, or over the first gate material 122, if the hard mask 123 is not used. The second layer of photoresist 124 may be patterned using a mask, using traditional lithography techniques to remove the second layer of photoresist 124 from over the first region 104 of the workpiece 102, as shown, although alternatively, the second layer of photoresist 124 may be directly patterned.

Figure 4:
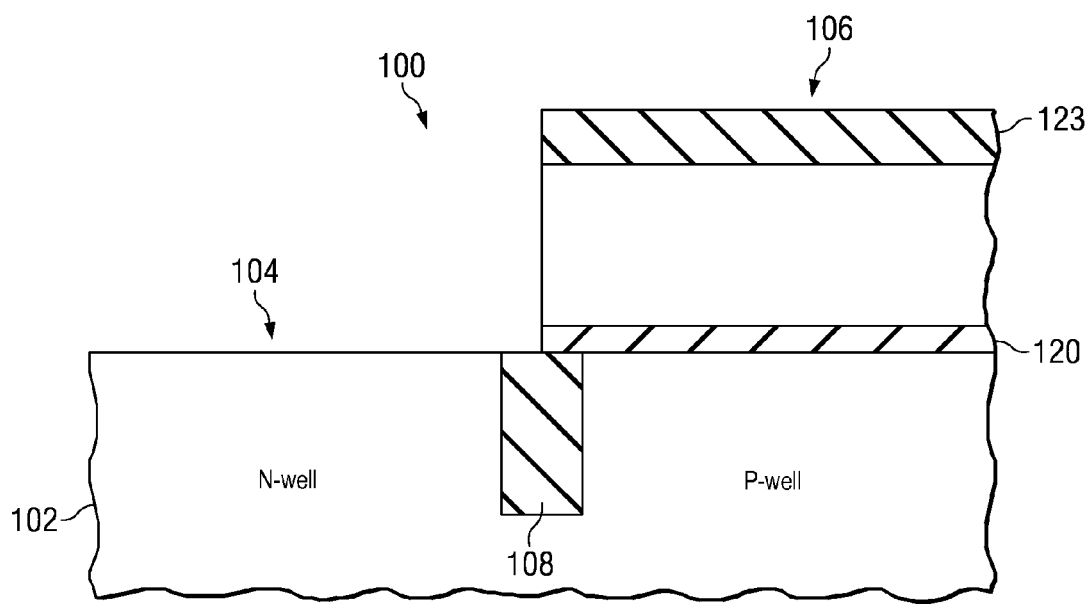

The second layer of photoresist 124 is used as a mask to pattern the first gate material 122, the first gate dielectric material 120 and also the hard mask 123, if used, and to remove the hard mask 112 from the first region 104 of the workpiece 102, as shown in FIG. 4. For example, exposed portions of the first gate material 122, first gate dielectric material 120, and hard mask 112 may be etched away from the first region 104 of the workpiece 102 using the second layer of photoresist 124 as a mask. The second layer of photoresist 124 is then stripped or removed from over the second region 106 of the workpiece 102. Any excess first gate material 122, first gate dielectric material 120, and optional hard mask 123 may be removed from over the optional STI region 108 proximate the interface of the first region 104 and second region 106 using a chemical-mechanical polish (CMP) process or an etch process, for example, leaving the structure shown in FIG. 4. The exposed surface of the workpiece 102 may be cleaned using a pre-gate clean process.

Figure 5:
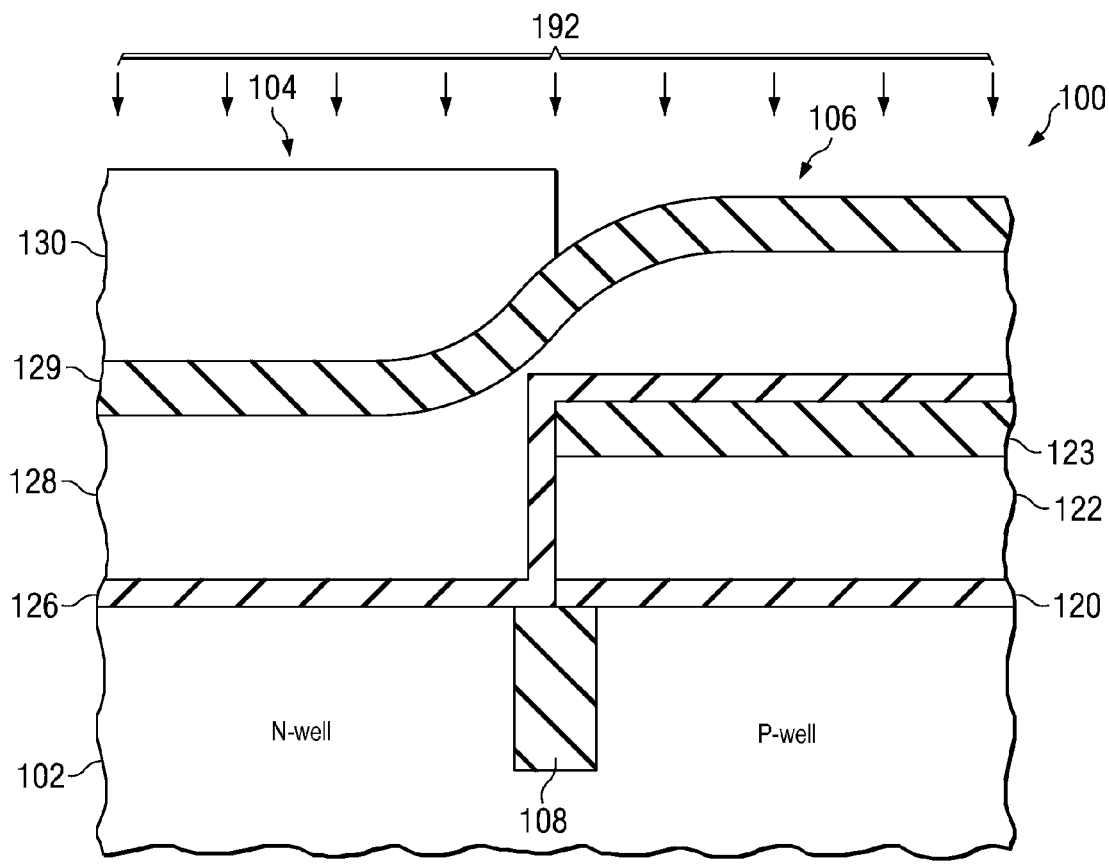

Next, a second gate dielectric material 126 is deposited over exposed portions of the workpiece 102 in the first region 104 and over the patterned first gate material 122 and first gate dielectric material 120 in the second region 106, as shown in FIG. 5. The second gate dielectric material 126 preferably comprises a different material and/or thickness than the first gate dielectric material 120 in one embodiment of the present invention. Alternatively, the second gate dielectric material 126 may comprise the same material and/or thickness as the first gate dielectric material 120, in one embodiment. The second gate dielectric material 126 preferably comprises a high-k dielectric material having a dielectric constant of about 4.0 or greater, in one embodiment. The second gate dielectric material 126 preferably comprises $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples, although alternatively, the second gate dielectric material 126 may comprise other high k insulating materials or other dielectric materials.

The second gate dielectric material 126 may comprise a single layer of material, or alternatively, the second gate dielectric material 126 may comprise two or more layers, wherein the top layer comprises a Fermi-pinning material, which will be described further herein with reference to FIG. 10. In one embodiment, one or more of these materials can be included in the second gate dielectric material 126 in different combinations or in stacked layers. The second gate dielectric material 126 may be deposited by CVD, ALD, MOCVD, PVD, or JVD, as examples, although alternatively, the second gate dielectric material 126 may be deposited using other suitable deposition techniques. The second gate dielectric material 126 preferably comprises a thickness of about 10 Å to about 60 Å in one embodiment, although alternatively, the second gate dielectric material 126 may comprise other dimensions, such as about 80 Å or less, as an example. The second gate dielectric material 126 preferably comprises a Fermi-pinning material such as an aluminum-containing material disposed at the top surface thereof.

Next, a second gate material 128 is deposited over the second gate dielectric material 126, also shown in FIG. 5. The second gate material 128 preferably comprises a semiconductive material, such as polysilicon or amorphous silicon, although alternatively, other conductive and semiconductive materials may be used for the second gate material 128. In the embodiment shown in FIGS. 1-9, the second gate material 128 preferably comprises polysilicon or other semiconductor materials. Alternatively, the second gate material 128 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. The second gate material 128 may comprise a plurality of stacked gate materials, such as a metal underlayer with a polysilicon cap layer disposed over the metal underlayer. The second gate material 128 may be deposited using CVD, PVD, ALD, or other deposition techniques, as examples. The second gate material 128 preferably comprises a thickness of about 1500

Å, although alternatively, the second gate material 128 may comprise about 1000 Å to about 2000 Å, or other dimensions, for example. The second gate material 128 may comprise the same material as the first gate material 122, or alternatively, the second gate material 128 may comprise a different material than the first gate material 122, for example.

In an optional step, the second gate material 128 may be doped at this point in the manufacturing process with an n-type dopant 192, e.g., by doping the second gate material 128 with As or phosphorous, for example. Doping the second gate material 128 makes the semiconductive material conductive or more conductive. Preferably, the work function of the PMOS transistor (see 136 in FIG. 9) is set by the material selection for the second gate dielectric material 126, rather than by the dopant implanted into the second gate material 128, in accordance with an embodiment of the present invention.

After implanting the dopant 192, an optional hard mask 129 may be deposited over the second gate material 128. The optional hard mask 129 protects the second gate material 128 from being implanted with the dopants that are implanted to form the source and drain extension regions and source and drain regions, to be described further herein. The hard mask 129 may not be deposited at this stage of the manufacturing process if the gate materials for the PMOS transistor and the NMOS transistor are n doped in a single step, as shown in FIG. 7. The hard mask 129 may comprise about 500 Å or less of an oxide or nitride material, as examples. In one embodiment, the hard mask 129 may comprise about 400 Å of TEOS, for example.

After the optional steps of implanting the dopant 192 and forming the hard mask 129, a third layer of photoresist 130 is deposited over the second gate material 128, as shown in FIG. 5. The third layer of photoresist 130 may patterned using a mask by traditional lithography techniques to remove the third layer of photoresist 130 from the second region 106 of the workpiece 102, as shown, although alternatively, the third layer of photoresist 130 may be directly patterned.

Figure 6:
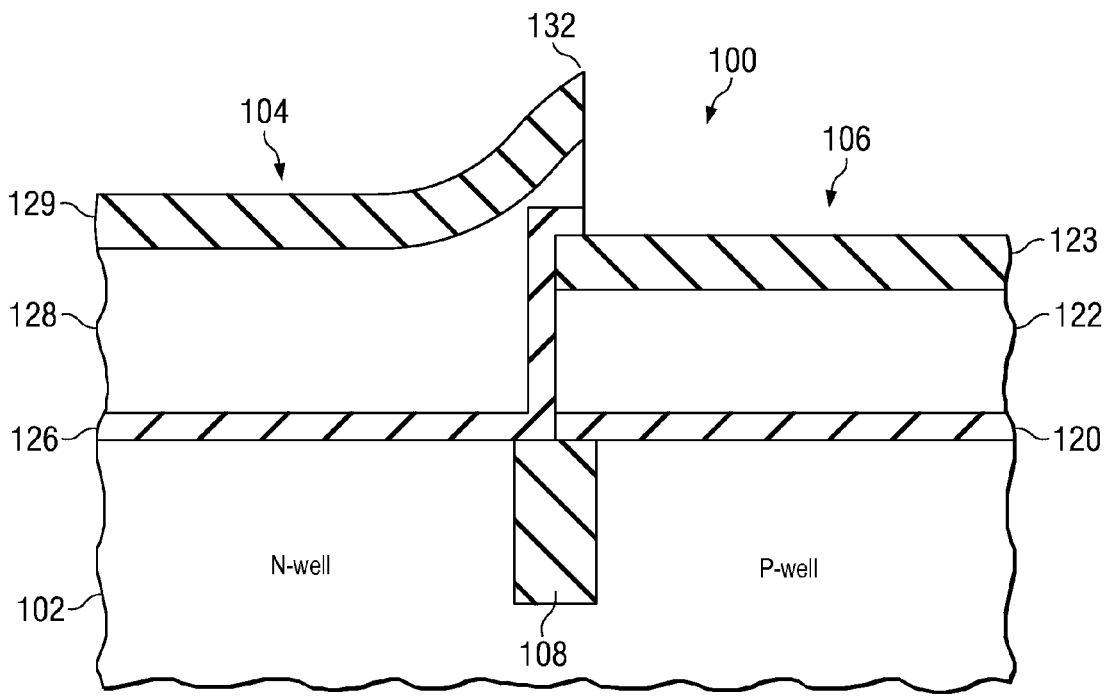

The third layer of photoresist 130 is then used as a mask to pattern the second gate material 128, second gate dielectric material 126, and optional hard mask 129, as shown in FIG. 6. For example, exposed portions of the second gate material 128, second gate dielectric material 126, and hard mask 129 may be etched away from the second region 106 of the workpiece 102 using the third layer of photoresist 130 as a mask. The third layer of photoresist 130 is then stripped or removed from over the first region 104 of the workpiece 102.

Any excess second gate material 128, second gate dielectric material 126, and optional hard mask 129 (e.g., as shown at peak 132) may be removed from over the optional STI region 108 proximate the interface of the first region 104 and second region 106 using a chemical-mechanical polish (CMP) process or an etch process, for example (not shown), leaving the structure shown in FIG. 7.

Figure 8:
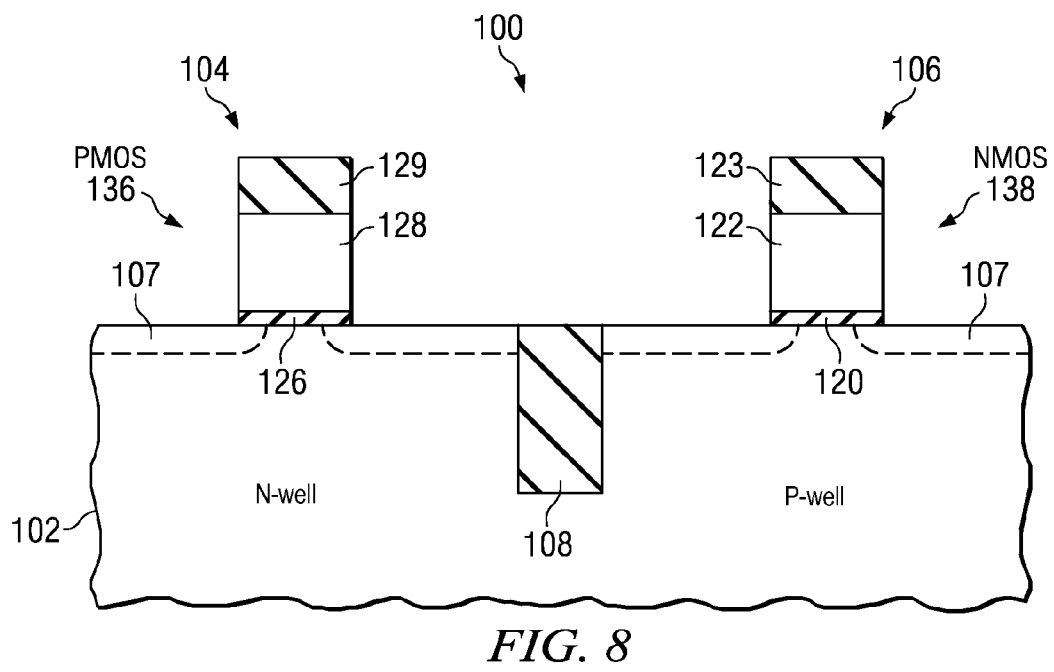

Preferably using a single lithography step, e.g., using a single layer of photoresist and using a single mask to pattern the photoresist, the first gate material 120, the first gate dielectric material 122, the second gate material 126, the second gate dielectric material 128, and optional hard masks 123 and 129, are simultaneously patterned with a desired pattern for a CMOS device, leaving the structure shown in FIG. 8, wherein a gate/gate dielectric stack 126/128/129 of a PMOS transistor 136 is formed in the first region 104, and a gate/gate dielectric stack 120/122/123 of an NMOS transistor 138 is formed in the second region 106.

Referring again to FIG. 7, note that while a vertical portion 160 of the second gate dielectric material 126 formed on the sidewall of the first gate material 122 is left remaining in the structure shown in FIG. 7, this is not problematic, because portion 160 is etched away or removed when the first and second gate materials 122 and 128, and first and second gate dielectric materials 120 and 126, are patterned and etched to form PMOS and NMOS transistors 136 and 138, as shown in FIG. 8.

In one embodiment, rather than implanting the first gate material 122 with a dopant 190 as shown in FIG. 3 and implanting the second gate material 128 with a dopant 192 as shown in FIG. 5 using two separate dopant implantation steps, the first gate material 122 and the second gate material 128 may be simultaneously implanted with a dopant 194, as shown in FIG. 7. Preferably, the dopant 194 in this embodiment comprises an n-type dopant. In this embodiment, the hard masks 123 and 129 have not been deposited yet, for example. The first gate material 122 and second gate material 128 may simultaneously be n doped by doping the first gate material 122 and second gate material 128 with phosphorous or As. Then a hard mask material 123/129 is deposited over the first gate material 122 and the second gate material 128. Note that in this embodiment, the hard mask 123/129 may comprise a single layer of material, and the vertical portion 160 of the second gate dielectric material 126 does not reside above the top surface of the first and second gate materials 122 and 128. The hard mask 123/129 may comprise about 500 Å or less of an oxide or nitride material, as examples. In one embodiment, the hard mask 129 may comprise about 400 Å of TEOS, for example.

Again, doping the first gate material 122 and second gate material 128 makes the semiconductive material conductive or more conductive. Preferably, the work function of the NMOS transistor 138 and PMOS transistor 136, shown in FIG. 8, is set by the material selection for the gate dielectric materials 120 and 126, rather than by the dopant 194 implanted into the first gate material 122 and second gate material 128, in accordance with an embodiment of the present invention. In particular, the "effective" work function of the NMOS transistor 138 and the PMOS transistor 136 are set by Fermi-pinning, by the interaction between the gate dielectric material 120 and 126 to the gate material 122 and 128, which is a departure from the bulk work function of the semiconductive material used for the gate materials 122 and 128, which effects the $V_t$.

Manufacturing of the CMOS device 100 is then continued to complete the fabrication of the CMOS device 100. For example, the exposed portions of the workpiece 102 may be lightly doped to form source and drain extensions 107 in the workpiece 102, as shown in FIG. 8. For example, while the second region 106 is masked, p-type dopants may be implanted into the first region 104, and while the first region 104 is masked, n-type dopants may be implanted into the second region 106. Spacers 134 comprising an insulating material such as an oxide or nitride may be formed on the sidewalls of the gate electrode materials 128 and 122, on the sidewalls of the gate dielectric materials 126 and 120, and on the sidewalls of the hard mask materials 123 and 129, forming the structure shown in FIG. 9. Source and drain regions S1 and D1, and S2 and D2 may be formed in exposed surfaces of the PMOS transistor 136 and the NMOS transistor 138, using a deeper implantation step, respectively. For example, the source and drain regions S1 and D1 may be doped with p-type dopants to form p-n-p junctions in the N well of the PMOS transistor 136, while the second region 106 is masked. Likewise, the source drain regions S2 and D2 may be doped with n-type dopants to form n-p-n junctions in the P well of the NMOS transistor 138, while the first region 104 is masked.

The workpiece 102 may be annealed to drive the dopants into the workpiece 102 and form the sources S1 and S2 and drains D1 and D2, for example.

If the first gate material 122 is doped with an n dopant, the hard mask 123 may be removed before implanting the workpiece 102 with an n dopant to form the source and drain extensions 107 and source and drains S2 and D2, for example.

Figure 9:
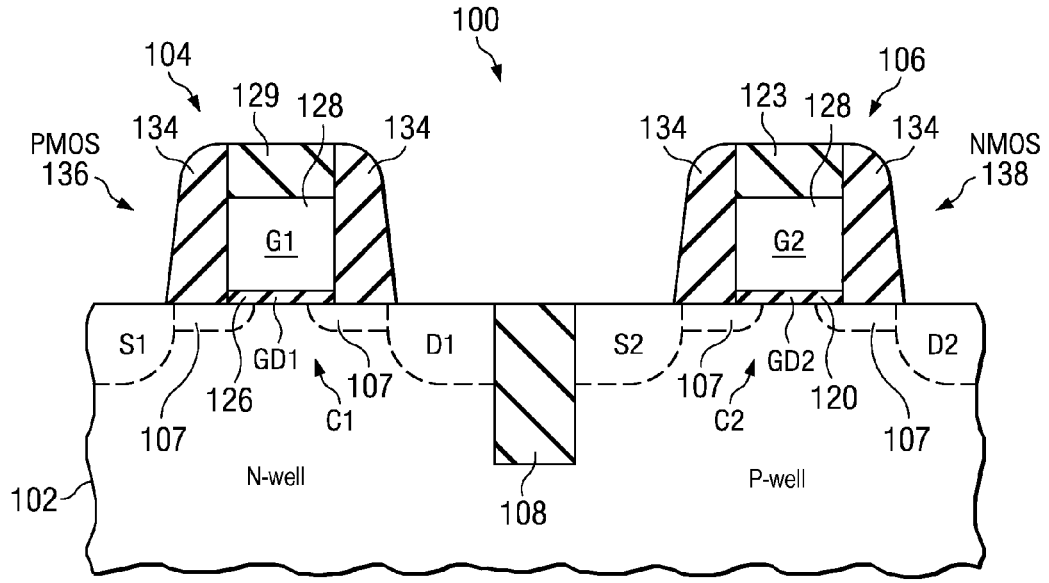
Figure 10:
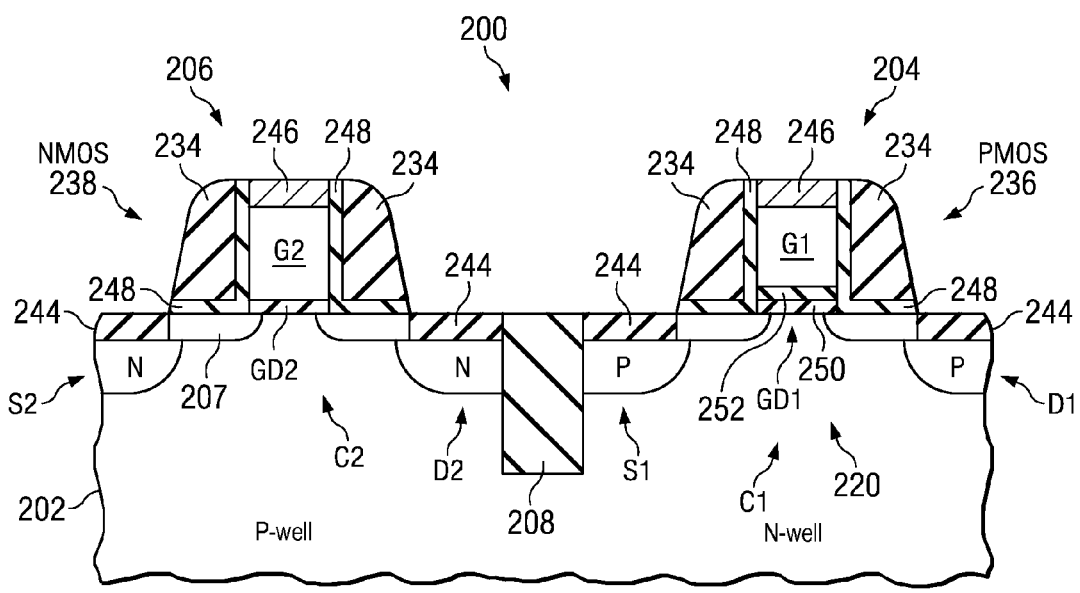
FIG. 10 shows an another preferred embodiment of the present invention, wherein the PMOS transistor gate dielectric comprises a first layer and a second layer, wherein the second layer is adjacent and abuts the PMOS transistor gate electrode, and wherein the second layer comprises a Fermi-pinning material.
Figure 17:
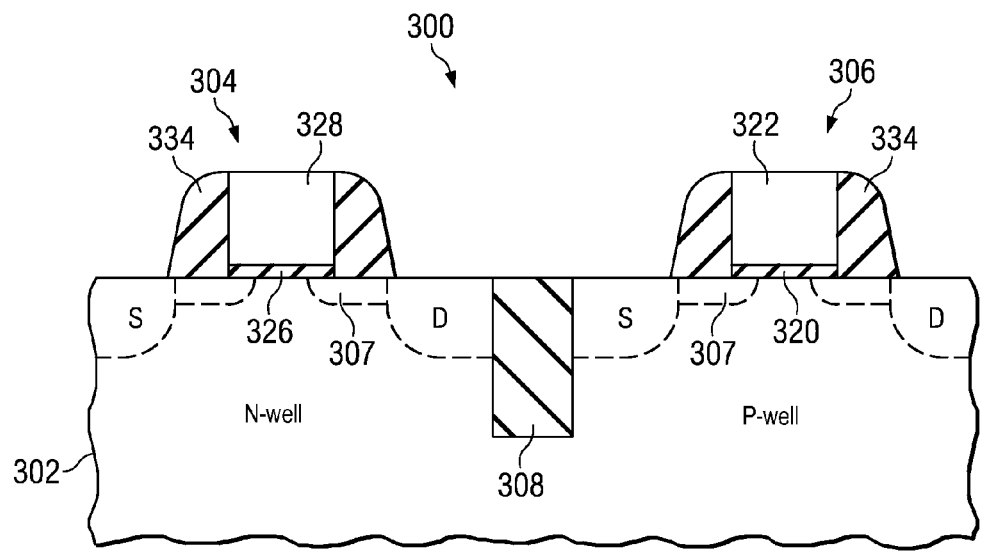
Figure 21:
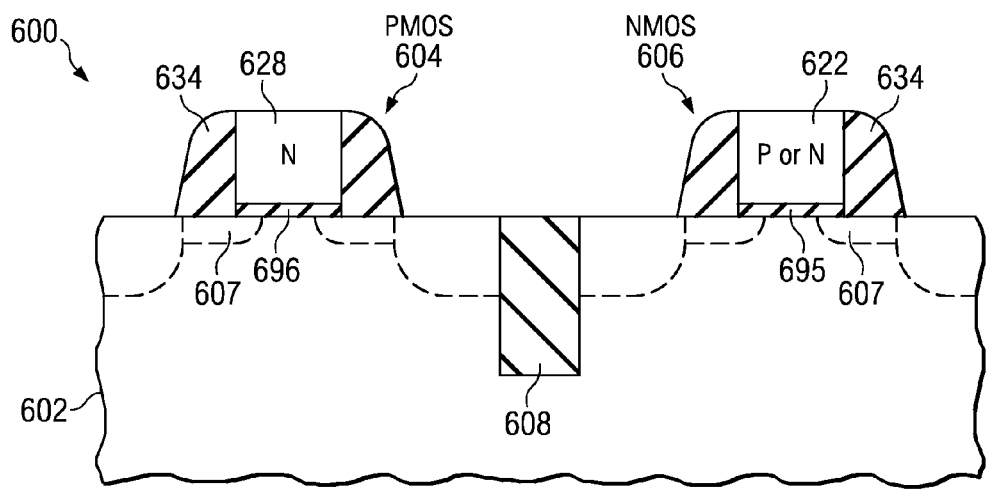
FIG. 21 shows a cross-sectional view of an embodiment of the present invention, wherein a gate of a PMOS transistor is doped with an n-type dopant, and the gate of an NMOS transistor is doped with a p-type or n-type dopant.

After the sources S1 and S2 and drains D1 and D2 are formed, the hard mask materials 123 and 129 may be removed from over the top surface of the gates G1 and G2 (not shown in FIG. 9; see FIGS. 10, 17 and 21, as examples). One or more insulating materials (not shown) may be deposited over the PMOS transistor 136 and NMOS transistor 138, and contacts may be formed in the insulating materials in order to make electrical contact with the gates, sources and/or drains. Additional metallization and insulating layers may be formed and patterned over the top surface of the insulating material and contacts. A passivation layer (not shown) may be deposited over the insulating layers or the PMOS transistor 136 and NMOS transistor 138. Bond pads (also not shown) may be formed over contacts, and the semiconductor device 100 may then be singulated or separated into individual die. The bond pads may be connected to leads of an integrated circuit package (not shown) or other die, for example, in order to provide electrical contact to the transistors 136 and 138 of the semiconductor device 100.

Thus, a novel semiconductor CMOS device 100 comprising a PMOS transistor 136 and an NMOS transistor 138 is formed, as shown in FIG. 9, wherein the gate dielectric GD1 of the PMOS transistor 136 comprises a different material and/or thickness than the material of the gate dielectric GD2 of the NMOS transistor 138. The gate dielectric GD1 of the PMOS transistor 136 preferably comprises a Fermi-pinning material abutting the gate G1. The PMOS transistor 136 includes a source S1 and a drain D1 separated by a first channel region C1. A gate dielectric GD1 is disposed over the first channel region C1, and a gate G1 is disposed over the gate dielectric GD1. The NMOS transistor 138 includes a source S2 and a drain D2 separated by a channel region C2. A gate dielectric GD2 is disposed over the channel region C2, and a gate G2 is disposed over the gate dielectric GD2. A spacer 134 comprising an oxide or nitride, as examples, may be formed on the sidewalls of the gates G1 and G2, and gate dielectrics GD1 and GD2, as shown.

The gate G1 of the PMOS transistor 136 is doped with an n-type dopant, in accordance with a preferred embodiment of the present invention. The gate G2 of the NMOS transistor 138 is preferably doped with either an n- or p-type dopant.

The gate and gate dielectric materials for either the PMOS transistor 136 or the NMOS transistor 138 may be deposited first, in accordance with embodiments of the present invention. For example, in the embodiment described herein with reference to FIGS. 1 through 9, the NMOS transistor 138 gate dielectric and gate materials are deposited first. Alternatively, the PMOS transistor 136 gate dielectric and gate materials may be deposited first.

Another preferred embodiment of the present invention is shown in FIG. 10. Like numerals are used for the various elements that were described in FIGS. 1 through 9. To avoid repetition, each reference number shown in FIG. 10 is not described again in detail herein. Rather, similar materials x02, x04, x06, x08, etc. . . . are preferably used for the various material layers shown as were described for FIGS. 1 through 9, where x=1 in FIGS. 1 through 9 and x=2 in FIG. 10. As an example, the preferred and alternative materials and dimensions described for the first and second gate dielectric materials 120 and 126 (GD2 and GD1, respectively) in the description for FIGS. 1 through 9 are preferably also used for the gate dielectric materials GD1 and GD2 of FIG. 10.

In this embodiment, the PMOS device 236 is shown in the right side of the figure, e.g., in first region 204, indicated by the "P" in the workpiece 202, and the NMOS device 238 is shown on the left side of the figure, e.g., in second region 206, indicated by the "N" in the workpiece 202 (whereas in FIGS. 1 through 9, the PMOS device 136 was shown on the left side, and the NMOS device was on the right 138). The gate dielectric GD1 in this embodiment may comprise at least two insulating layers: a first insulating layer 250 and a second insulating layer 252 disposed over the first insulating layer 250. The first insulating layer 250 preferably comprises a high-k dielectric material, and may comprise $HfO_2$, $HfSiO_x$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples, although alternatively, the first insulating layer 250 may comprise other high k insulating materials or other dielectric materials. The first insulating layer 250 preferably comprises a thickness of about 80 Angstroms or less, for example. The second insulating layer 252 preferably comprises about 10 to 60 Angstroms of a Fermi-pinning material. For example, the second insulating layer 252 preferably comprises an aluminum-containing material such as aluminum oxide ($Al_xO_y$ or $Al_2O_3$) or nitrides thereof, such as $Al_xO_yN_{1-x-y}$, as examples, although alternatively, the second insulating layer 252 may comprise other materials that induce Fermi-pinning of the gate dielectric GD1 to the gate electrode G1 of the PMOS device 236. The second insulating layer 252 may be deposited or may be formed by implanting a Fermi-pinning material such as aluminum, for example. The gate dielectric GD1 may alternatively comprise a single layer, e.g., comprising a Fermi-pinning material, such as $HfAlO_x$, $HfAlO_xN_y$, or $Al_2O_3$.

This embodiment also shows other optional elements that may be included in the CMOS device 200, and in the other CMOS devices 100, 300, 400, 600 and 700 described herein. Before forming spacers 234 over the sidewalls of the gate dielectric GD1 and GD2 and gates G1 and G2, an optional thin insulator 248 may be formed over the top surface of the sources S1 and S2 and drains D1 and D2, the sidewalls of the gate dielectrics GD1 and GD2, and gates G1 and G2, as shown. The spacers 234 are then formed over the thin insulator 248. The thin insulator 248 may comprise an oxide, and the spacers 234 may comprise a nitride, although alternatively, other materials may be used for the thin insulator 248 and the spacers 234, for example.

The sources S1 and S2 or the drains D1 and D2, or the gates G1 and G2, may include an optional silicide material 244 and 246, respectively, formed at a top surface thereof (often referred to as a salicide because the formation of the silicide may be self-aligning). The silicide 244 and 246 may comprise about 100 Å to 300 Å of $TiSi_x$, $CoSi_x$, or $NiSi_x$, although the silicide 244 and 246 may alternatively comprise other materials and thicknesses, as examples. The sources S1 and S2 and drains D1 and D2 may include lightly doped areas and deeper implantation regions, as shown. The gates G1 and G2 may also by fully silicided, e.g., by heating the workpiece 202 to cause the silicide material 244 and 246 to combine with the underlying gate material, in one embodiment.

The novel CMOS device of embodiments of the present invention described herein having a PMOS transistor and an NMOS transistor that have gate dielectrics comprising different materials and wherein the PMOS transistor gate is doped with an n dopant, may be manufactured using other methods.

Two examples of such other methods are shown FIGS. 11 through 17, and FIGS. 18 and 19, respectively. Again, like numerals are used for the various elements that were described in FIGS. 1 through 9 and 10, and to avoid repetition, each reference number shown in FIGS. 11 through 17, and FIGS. 18 and 19 is not described again in detail herein. Rather, similar materials x02, x04, x06, x08, etc. . . . are preferably used for the various material layers shown as were described for FIGS. 1 through 9, where x=1 in FIGS. 1 through 9, x=2 in FIG. 10, x=3 in FIGS. 11 through 17, and x=4 in FIGS. 18 and 19.

Figure 11:
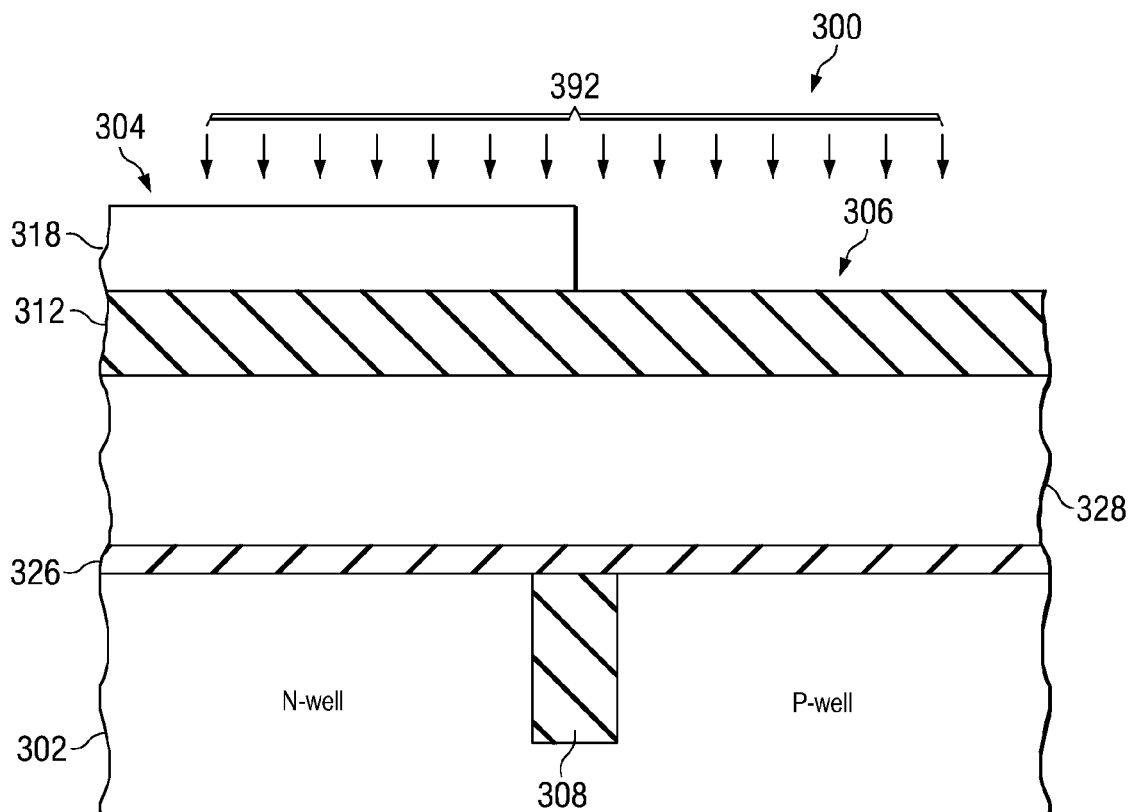
FIGS. 11 through 17 show cross-sectional views of methods of forming a CMOS device in accordance with other preferred embodiments of the present invention at various stages of manufacturing, wherein the PMOS transistor gate is doped with an n-type dopant.
Figure 12:
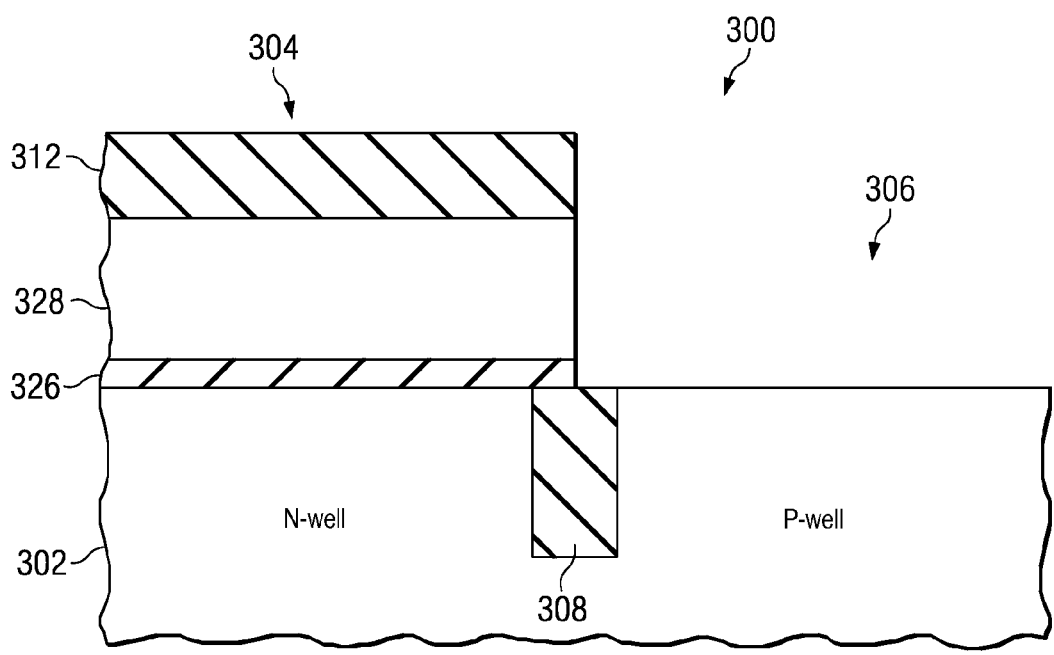

FIGS. 11 through 15 and 17 show cross-sectional views of a method of forming a CMOS device having different gate dielectric materials for the PMOS transistor and NMOS transistor in accordance with another preferred embodiment of the present invention at various stages of manufacturing. In this embodiment, starting with a workpiece such as 102 shown in FIG. 1, the second gate dielectric material 326 is deposited over the entire top surface of the workpiece 302. The second gate material 328 is then deposited over the entire surface of the second gate dielectric material 326, as shown in FIG. 11. Optionally, the second gate material 328 may be implanted with an n-type dopant 392 at this point in the manufacturing process, for example. An optional hard mask 312 may be formed over the second gate material 328, as shown. The second gate material 328, second gate dielectric material 326, and optional hard mask 312 are then removed from over the second region 306 of the workpiece, as shown in FIG. 12.

For example, a layer of photoresist 318 may be deposited over the optional hard mask 312, and the photoresist 318 may be removed from over the second region 306 using lithography techniques, for example, as shown in FIG. 11. The photoresist 318 may be used as a mask to pattern the hard mask 312 and second gate material 328 to remove layers 312, 328 and 326 from over the second region 306 of the workpiece 302, and the photoresist 318 may be stripped or ashed, as shown in FIG. 12.

Figure 13:
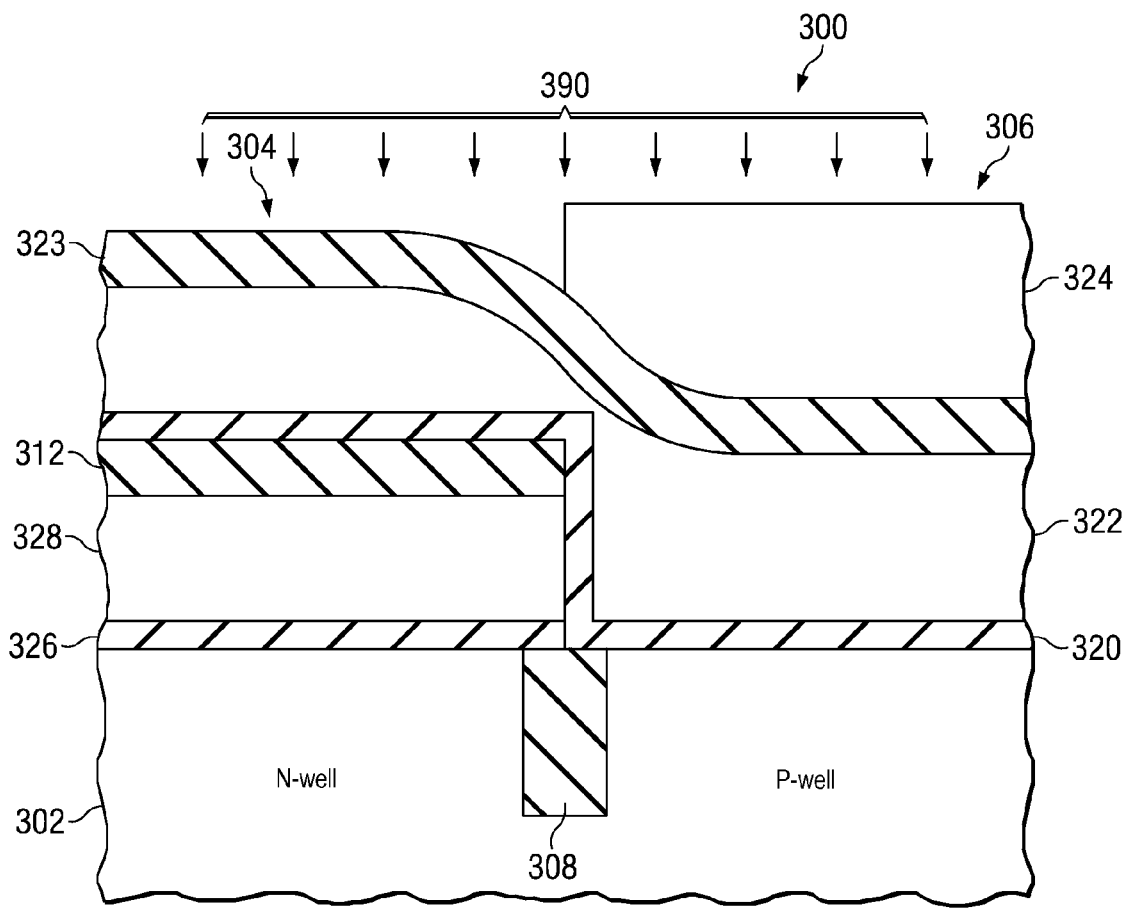

Next, the first gate dielectric material 320 and the first gate material 322 are deposited over the second region 306 of the workpiece 302 and over the second gate material 328 over the first region 304 of the workpiece 302, as shown in FIG. 13. The first gate material 322 may optionally be doped with a dopant 390 comprising a p-type or n-type dopant. An optional hard mask 323 may be formed over the first gate material 322 after the optional doping step, as shown. The first gate dielectric material 320 and the first gate material 322 are then removed from over the first region 304 of the workpiece. For example, a layer of photoresist 324 may be deposited over the workpiece 302, and the photoresist 324 may be patterned to remove the photoresist 324 from over the first region 304 of the workpiece 302, as shown in FIG. 13. The photoresist 324 is then used as a mask while the first gate material 322, first gate dielectric material 320, and optional hard mask 323 are removed from the first region 304 of the workpiece.

Figure 14:
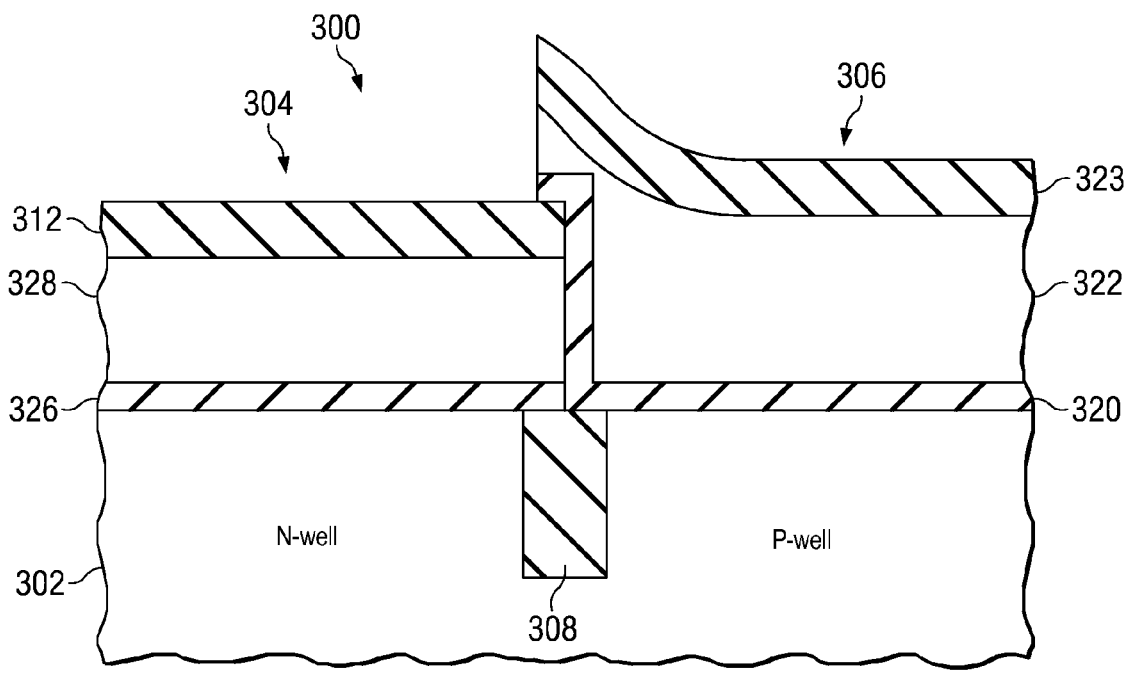
Figure 15:
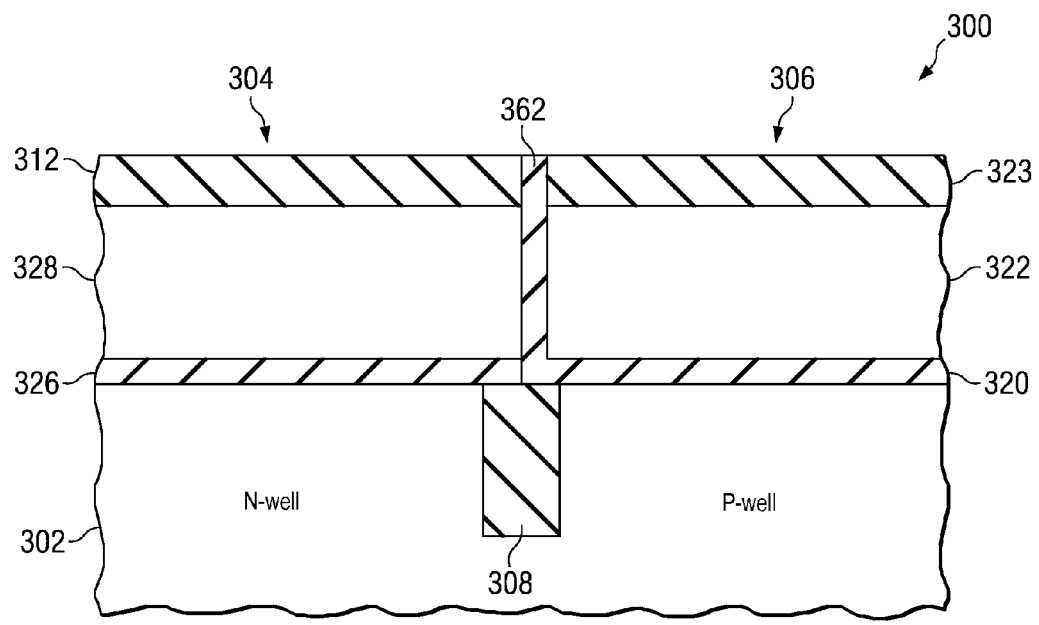

The photoresist 324 is then removed, as shown in FIG. 14, and the top surface of the first gate material 322 and the second gate material 328 (or optional hard masks 312 and 323, as shown) are then planarized, e.g., using CMP or an etch process, for example, leaving the structure shown in FIG. 15. While a vertical portion 362 of the first gate dielectric material 320 formed on the sidewall of the second gate material 322 is left remaining in the structure shown in FIG. 16, this is not problematic, because portion 362 will be etched away when the PMOS and NMOS transistors are formed, as shown in FIGS. 8 through 10. The first gate material 322, the first gate dielectric material 320, the second gate material 328, the second gate dielectric material 326, and optional hard masks 323 and 329, are patterned with a pattern for a CMOS device, source and drain regions are formed in the workpiece 302, and the hard masks 323 and 329 are removed, leaving the structure shown in FIG. 17, wherein a PMOS transistor is formed in the first region 304 of the workpiece 302, and an NMOS transistor is formed in the second region 306 of the workpiece 302. The embodiment shown in FIGS. 11 through 15 and 17 is advantageous in that one less lithography mask is required, compared to the embodiment shown in FIGS. 1 through 9.

Figure 16:
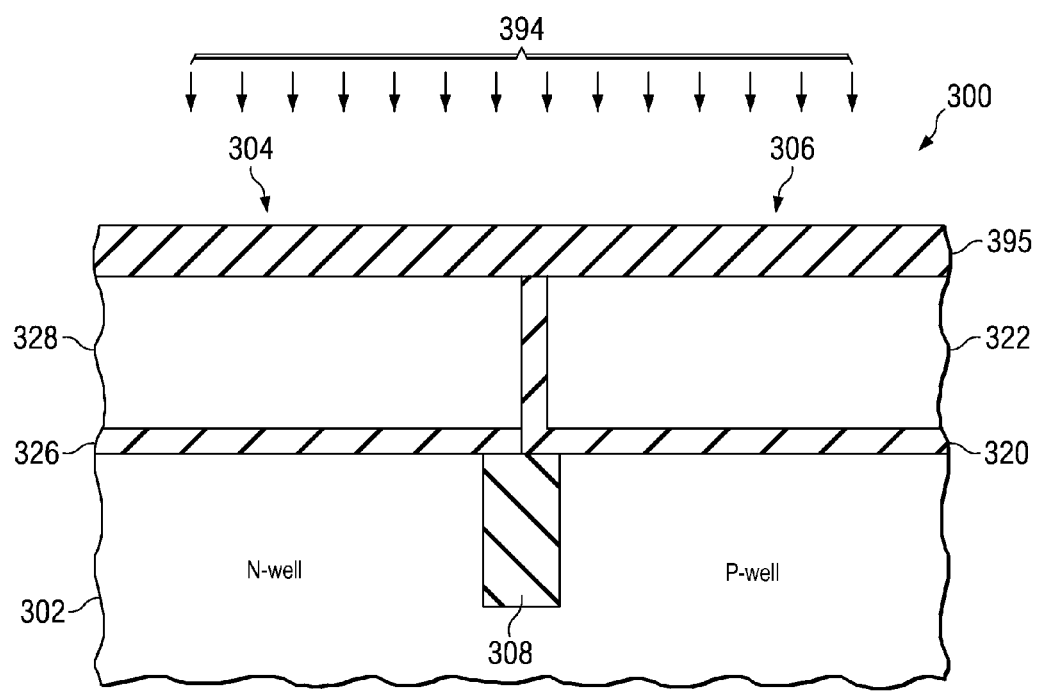

FIGS. 16 and 17 show cross-sectional views of a method of forming a CMOS device 300, wherein rather than separately doping the second gate material 326 with a dopant 392 as shown in FIG. 11, and doping the first gate material 322 with a dopant 390 as shown in FIG. 13, a single doping step is used to dope the first gate material 322 and the second gate material 328 with a dopant 394, as shown in FIG. 16. The dopant 394 is preferably n type in this embodiment. The first gate material 322, the first gate dielectric material 320, the second gate material 328, the second gate dielectric material 326, and optional hard masks 323 and 329, are patterned with a pattern for a CMOS device, source and drain regions are formed in the workpiece 302, and the hard masks 323 and 329 are removed, leaving the structure shown in FIG. 17, wherein a PMOS transistor is formed in the first region 304 of the workpiece 302, and an NMOS transistor is formed in the second region 306 of the workpiece 302. The embodiment shown in FIGS. 16 and 17 is advantageous in that one less doping step and one less hard mask (either 323 or 329) deposition step is required.

Figure 18:
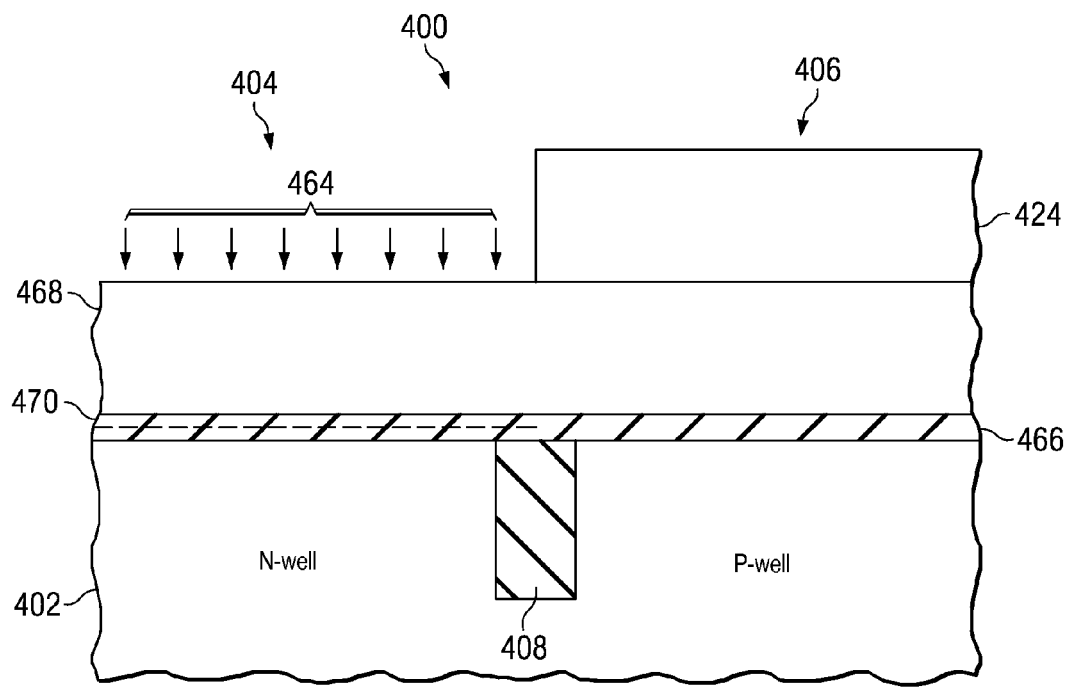
FIGS. 18 and 19 show cross-sectional views of a method of forming a CMOS device in accordance with yet another preferred embodiment of the present invention at various stages of manufacturing, wherein the PMOS transistor gate is doped with an n-type dopant.
Figure 19:
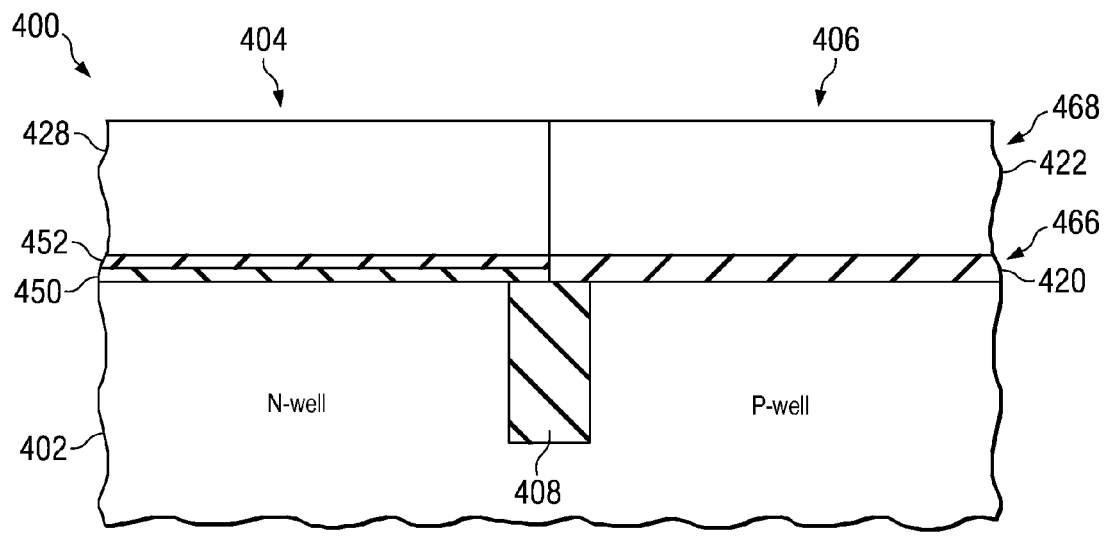

FIGS. 18 and 19 show yet another preferred embodiment of the present invention. In this embodiment, advantageously, a single layer of gate dielectric material 466 and a single layer of gate material 468 are deposited over the top surface of the workpiece 402. The single layer of gate dielectric material 466 and the single layer of gate material 468 may comprise one type of material, or may alternatively comprise one or more material layers, for example. The single layer of gate dielectric material 466 is also referred to herein as an insulating layer 466, and the single layer of gate material 468 is also referred to herein as a conductive layer 468, for example.

The gate dielectric material 466 preferably comprises $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, combinations thereof, or combinations thereof with $SiO_2$, for example, although alternatively, the gate dielectric material 466 may comprise other materials. The gate dielectric material 466 may comprise a thickness of a few hundred Angstroms or less, for example. The gate material 468 may comprise a semiconductor material or a combination of a semiconductor material and a metal, for example. For example, the gate material 468 may comprise polysilicon, other semiconductor materials, TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples.

In this embodiment, in the first region 404 where a PMOS transistor will be formed, a Fermi-pinning material 464 is implanted. Preferably, the Fermi-pinning material 464 is implanted in the first region 404 but not in the second region 406, as shown. For example, the gate material 468 may be covered with photoresist 424 or an insulating material during the implantation process, as shown. Implanting the Fermi-pinning material 464 may comprise implanting aluminum, for example, although alternatively, the Fermi-pinning 464 may comprise other Fermi-pinning materials.

Preferably, the Fermi-pinning material 464 is implanted into at least the conductive layer 468 over the first region 404 of the workpiece 402, as shown. For example, the Fermi-pinning material 464 is preferably also implanted into a top surface 470 of the insulating layer 466.

Because the Fermi-pinning material 464 is implanted into the first region 404 and not the second region 406, the gate material and gate dielectric material for the first region 404 and second region 406 are now advantageously different, producing the novel CMOS device having different gate dielectric materials and symmetric $V_t$ for a PMOS transistor and NMOS transistor, as shown in FIGS. 9 and 10.

Note that preferably, in accordance with an embodiment of the present invention, the gate material 468 in the first region 404 may be doped with an n-type dopant. For example, the gate material 468 in the first region 404 may be doped with the n-type dopant while the second region 406 is masked. Alternatively, the gate material 468 in the first region 404 and the second region 406 may be simultaneously doped with the n-type dopant, for example. In one embodiment, the gate material 468 in the second region 406 may be doped with a p-type dopant while the first region 404 is masked. The gate materials 468 of the first region 404 and the second region 406 may be doped with different amounts of an n-type dopant, for example.

The structure shown in FIG. 19 illustrates that the single conductive layer 468, after implanting the Fermi-pinning material 464, forms a first gate material 422 in the second region 406 and a second gate material 428 in the first region 404. Likewise, the single insulating layer 466 forms a first gate dielectric material 420 in the second region 406 and a second gate dielectric material comprising a first insulating layer 450 and a second insulating layer 452 in the first region 404. The device 400 is then patterned and the manufacturing process is continued to produce a novel CMOS device such as the one shown in a cross-sectional view in FIG. 9. The embodiment shown in FIGS. 18 and 19 is advantageous in that the number of lithography masks required to manufacture the device 400 is further reduced.

Figure 20:
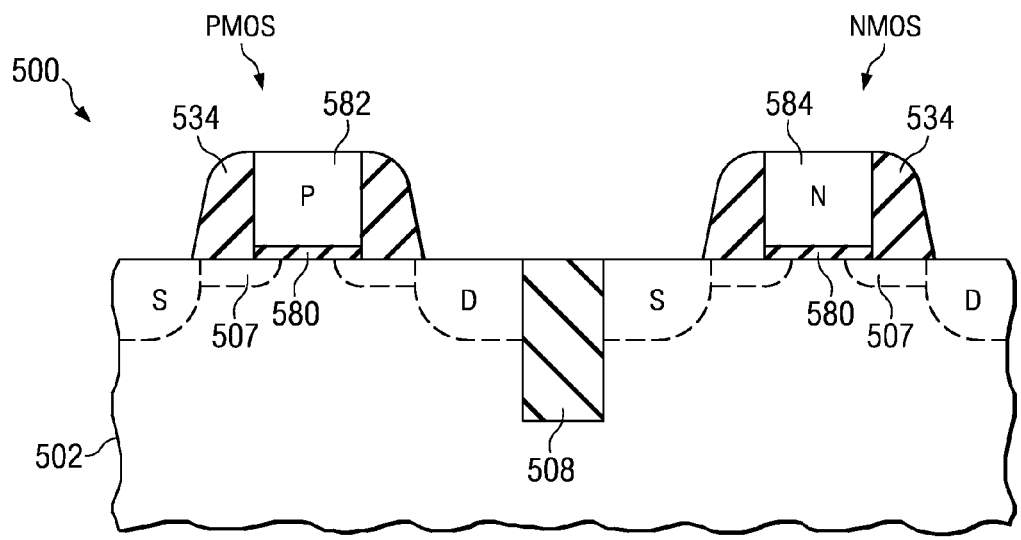
FIG. 20 shows a prior art CMOS device, wherein the gate of the PMOS transistor is doped with a p-type dopant, and the gate of the NMOS transistor is doped with an n-type dopant.

FIG. 20 shows a cross-sectional view of a prior art CMOS device 500, wherein the gate 582 of the PMOS device is doped with a p-type dopant, and the gate 584 of the NMOS device is doped with an n-type dopant. This CMOS device 500 may exhibit the polysilicon depletion effect when operated in the inversion regime.

FIG. 21 shows a cross-sectional view of another embodiment of the present invention. In this embodiment, preferably, the gate 628 of the PMOS device is doped with an n-type dopant, and the gate 622 of the NMOS device is doped with either a p-type dopant or an n-type dopant. In this embodiment, the gate dielectric materials 694 and 696 may be the same material, or may comprise different materials. If the NMOS device comprises a single device, preferably the gate is doped with a p-type dopant, in one embodiment.

Embodiments of the present invention also include single PMOS and/or NMOS transistor devices. Referring only to the left side of FIG. 21 (e.g., disregarding the NMOS device in region 606), a single PMOS device such as the one shown in FIG. 20 preferably comprises a gate 628 that is doped with an n-type dopant. The gate dielectric 696 preferably comprises a high k dielectric material, e.g., having a dielectric constant of about 4.0 or greater. Likewise, referring only to the right side of FIG. 21 (e.g., disregarding the PMOS device in region 604), a single NMOS device in accordance with an embodiment of the present invention preferably comprises a gate 622 that is doped with a p-type dopant. The gate dielectric 694 of the NMOS device preferably comprises a high k dielectric material, e.g., having a dielectric constant of about 4.0 or greater.

Figure 22:
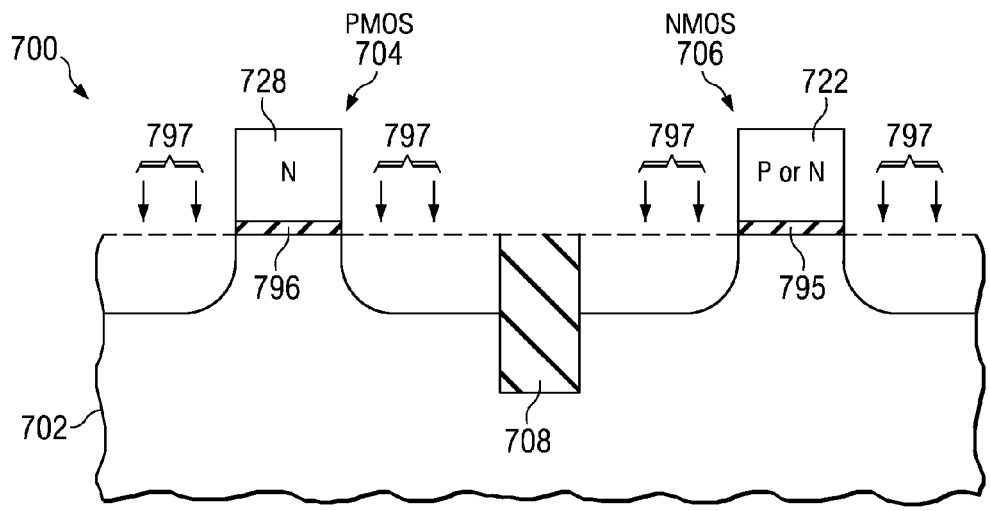
FIGS. 22 and 23 show another embodiment of the present invention, wherein the source and drain regions are formed by etching back the workpiece after patterning the gate and gate dielectric material, and filling the source and drain regions in with an in-situ doped material.
Figure 23:
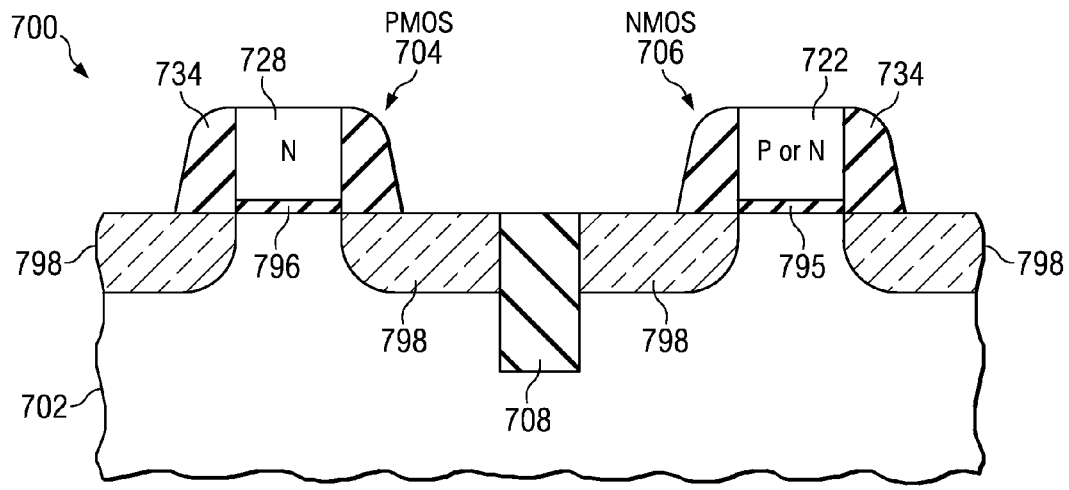

The CMOS devices 100, 200, 300, 400, 600, and 700 and PMOS and NMOS transistors may include source and drain regions that are formed by implantation, as described herein. Alternatively, the source and drain regions described herein may be formed using other methods. For example, as shown in FIG. 22, after patterning the gate materials 722 and 728 and gate dielectric materials 795 and 796, the workpiece 702 may be etched to remove a top portion of the workpiece 702, as shown. For example, an anisotropic etch selective to silicon may be used to remove a few hundred Å, e.g., 200 to 1000 Å of the workpiece. In one embodiment, a top portion of the STI region 708 material may be partially etched or removed during the etchback of the workpiece 702, for example, not shown. The workpiece 702 is then backfilled in the etched areas with a semiconductive material, such as SiGe, SiGeC or other materials. The backfilled semiconductive material may be in-situ doped, using a precursor of the desired dopant for the source and drain regions 798, for example. The first region 704 may be masked while the second region 706 is backfilled, and vice versa. The PMOS transistor source and drain regions 798 may be formed using in-situ B doped SiGe, and the NMOS transistor source and drain regions 798 may be formed using in-situ phosphorous doped SiGe, as examples. After the backfilling step, the hard masks (not shown in FIGS. 22 and 23) may be removed, and the spacers 734 are formed, as shown in FIG. 23.

Advantages of embodiments of the invention include providing methods of fabricating CMOS devices 100, 200, 300, 400, 600, and 700 and structures thereof wherein the PMOS transistor 136 and 236 and the NMOS transistor 138 and 238 have a substantially symmetric $V_t$. For example, $V_{tn}$ may be about +0.2 to +5 V, and $V_{tp}$ may be the substantially the same negative value, e.g., about −0.2 to −5 V. The threshold voltages $V_t$ may alternatively comprise other voltage levels, for example. Work function symmetry may be achieved by using a different dielectric material GD1 and GD2 for the PMOS transistor 136 and 236 and the NMOS transistor 138 and 238, respectively. The threshold voltage $V_t$ is decreased compared to prior art CMOS devices, and the flat band voltage is easier to tune. Embodiments of the invention may utilize high-k dielectric materials as the gate dielectric GD1 and GD2, using semiconductive material or silicided semiconductive material electrodes G1 and G2. In one embodiment, wherein the top layer of the gate dielectric of the PMOS transistor 136 and 236 comprises an aluminum-containing material, the fact that Si—Al pins to p-type and Si—Hf pins to n-type is utilized, to take advantage of the Fermi-pinning effect rather than trying to solve the Fermi-pinning effect or work around it by changing the material of the gate electrode. Polysilicon depletion and boron penetration effects are prevented when the devices 100, 200, 300, 400, 600, and 700 are operated in an inversion mode, because the semiconductive material of the gates function in an accumulation regime, due to the presence of the dopant. The capacitance effective thickness (CET) of a CMOS device can be decreased in accordance with embodiments of the present invention, e.g., by about 4 Angstroms or greater.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a complementary metal oxide semiconductor (CMOS) device, the method comprising:
    forming a hard mask over first and second regions of a workpiece, wherein the first region is n-type and the second region is p-type;
    removing the hard mask from over the second region but not from over the first region, thereby exposing the second region of the workpiece;
    depositing a first gate dielectric material on the hard mask over the first region, and on the second region of the workpiece;
    depositing a first gate material on the first gate dielectric material;
    removing, in a single step, the hard mask, the first gate dielectric material and the first gate material from over the first region but not from over the second region, thereby exposing the first region of the workpiece;
    depositing a second gate dielectric material on the first region of the workpiece, and on the gate material over the second region;
    depositing a second gate material on the second gate dielectric material;
    removing the second gate dielectric material and the second gate material from over the second region but not from over the first region;
    patterning the first gate material and the first gate dielectric material to form a negative channel metal oxide semiconductor (NMOS) gate/gate dielectric stack over the second region; and
    patterning the second gate material and the second gate dielectric material to form a positive channel metal oxide semiconductor (PMOS) gate/gate dielectric stack over the first region.

2. The method of claim 1, wherein the first and second gate dielectric materials comprise different materials from each other.

3. The method of claim 2, wherein the first and second gate dielectric materials are high-k dielectric materials.

4. The method of claim 1, further comprising forming source/drain regions adjacent each of the PMOS and NMOS gate/gate dielectric stacks.

5. The method of claim 1, further comprising doping the second gate material with an n-type dopant.

6. The method of claim 1, wherein removing the hard mask from over the second region comprises:
    forming a first photoresist layer on the hard mask;
    removing the first photoresist layer from the second region but not from the first region; and
    using the first photoresist layer to remove the hard mask from over the second region.

7. The method of claim 1, wherein removing the hard mask, the first gate dielectric material and the first gate material from over the first region comprises:
    (a) forming a second photoresist layer on the first gate material;
    (b) removing the second photoresist layer from the first region but not from the second region; and
    (c) using the second photoresist layer to remove the hard mask, the first gate dielectric material and the first gate material from over the first region; and
    wherein removing the second gate dielectric material and the second gate material from over the second region comprises:
    (a) forming a third photoresist layer on the second gate material;
    (b) removing the third photoresist layer from the second region but not from the first region; and
    (c) using the third photoresist layer to remove the second gate dielectric material and the second gate material from over the second region.

8. The method of claim 1, further comprising performing the patterning steps at a same time.

9. The method of claim 1, wherein forming the hard mask further comprises:
    forming an oxide layer over the first and second regions of the workpiece; and
    forming a nitride layer on the oxide layer.

* * * * *